United States Patent
Murata

(10) Patent No.: US 11,069,838 B2
(45) Date of Patent: Jul. 20, 2021

(54) LIGHT-EMITTING DEVICE WITH LIGHT-EMITTING ELEMENT MOUNTED ON SUPPORTING MEMBER AND DISPLAY APPARATUS

(71) Applicant: Rohm Co., Ltd., Kyoto (JP)

(72) Inventor: Sosuke Murata, Kyoto (JP)

(73) Assignee: ROHM CO, LTD., Kyoto (JP)

( * ) Notice: Subject to any disclaimer, the term of this patent is extended or adjusted under 35 U.S.C. 154(b) by 117 days.

(21) Appl. No.: 16/527,752

(22) Filed: Jul. 31, 2019

(65) Prior Publication Data
US 2020/0052166 A1 Feb. 13, 2020

(30) Foreign Application Priority Data
Aug. 9, 2018 (JP) .............................. JP2018-150462

(51) Int. Cl.
H01L 33/48 (2010.01)
H01L 33/58 (2010.01)
H01L 23/00 (2006.01)
H01L 33/62 (2010.01)

(52) U.S. Cl.
CPC ............ *H01L 33/486* (2013.01); *H01L 24/48* (2013.01); *H01L 33/58* (2013.01); *H01L 33/62* (2013.01); *H01L 2224/48091* (2013.01)

(58) Field of Classification Search
None
See application file for complete search history.

(56) References Cited

U.S. PATENT DOCUMENTS

| | | | | |
|---|---|---|---|---|
| 2010/0243299 A1* | 9/2010 | Kariya | ................ | H01L 23/5384 174/255 |
| 2012/0126269 A1* | 5/2012 | Tanuma | ................... | H01L 33/52 257/98 |
| 2012/0205710 A1* | 8/2012 | Kobayakawa | ........ | H01L 33/486 257/99 |
| 2013/0299860 A1* | 11/2013 | Mineshita | ............... | H01L 33/56 257/98 |
| 2014/0120793 A1* | 5/2014 | Akahane | .................. | C08K 5/56 442/180 |
| 2015/0003077 A1* | 1/2015 | Tanuma | ................... | H01L 33/62 362/311.1 |

FOREIGN PATENT DOCUMENTS

JP 2010-67862 A 3/2010

* cited by examiner

*Primary Examiner* — Nduka E Ojeh
(74) *Attorney, Agent, or Firm* — Hamre, Schumann, Mueller & Larson, P.C.

(57) ABSTRACT

A light-emitting device includes a light-emitting element having an element front surface and an element back surface spaced apart from each other in a first direction, a supporting member on which the light-emitting element is mounted, and a light-transmitting resin formed on the supporting member to cover the light-emitting element. The supporting member includes a base having a base front surface and a base back surface opposite to the base front surface, and first and second wirings each disposed on the base and electrically connected to the light-emitting element. The light-emitting element is mounted on the support member with the element back surface facing the base front surface.

18 Claims, 19 Drawing Sheets

US 11,069,838 B2

LIGHT-EMITTING DEVICE WITH LIGHT-EMITTING ELEMENT MOUNTED ON SUPPORTING MEMBER AND DISPLAY APPARATUS

FIELD

The present disclosure relates to a light-emitting device and a display apparatus utilizing the light-emitting device.

BACKGROUND

JP-A-2010-67862 discloses a conventional light-emitting device. The light-emitting device disclosed in the document includes a resin package (supporting member) having a recess, a pair of leads (wiring pattern) having exposed portions at the bottom of the recess, a semiconductor element (light-emitting element) disposed in the recess on one of the leads at the bottom of the recess, and a sealing resin covering the recess. In the following description, such a recess is referred to as an accommodating recess. The wall surface of the accommodating recess is inclined with respect to the thickness direction of the light-emitting device and serves as a reflecting plate for reflecting light emitted from the semiconductor light-emitting element. The light-emitting device can be used as a light source of a display apparatus.

SUMMARY

With the recent trend for display apparatuses to be smaller and capable of displaying data at higher density, the mounting area for a light-emitting device has been reduced. This requires light-emitting devices to be smaller in plan-view dimensions. Unfortunately, it is not easy to reduce the plan-view dimensions of conventional light-emitting devices having an accommodating recess with an inclined wall surface.

In view of the issues noted above, the present disclosure aims to provide a light-emitting device smaller in plan view and also a display apparatus using such a light-emitting device.

According to a first aspect of the present disclosure, there is provided a light-emitting device including: a light-emitting element having an element front surface and an element back surface spaced apart from each other in a first direction; a supporting member on which the light-emitting element is mounted; and a light-transmitting resin formed on the supporting member to cover the light-emitting element. The supporting member includes a base having a base front surface and a base back surface opposite to the base front surface, and a first wiring and a second wiring each disposed on the base and electrically connected to the light-emitting element. The light-emitting element is mounted on the support member with the element back surface facing the base front surface.

According to a second aspect of the present disclosure, there is provided a display apparatus including: a light-emitting device of the first aspect noted above; a mounting substrate on which the light-emitting device is mounted; and a housing surrounding the light-emitting device. The mounting substrate and the housing are spaced apart from each other with a gap in the first direction. The dimension of the supporting member of the light-emitting device in the first direction is larger than the distance between the mounting substrate and the housing in the first direction.

Further features and advantages of devices and apparatuses disclosed herein will become apparent from the following detailed description with reference to the attached drawings.

DRAWINGS

EMBODIMENTS

Figure 1:
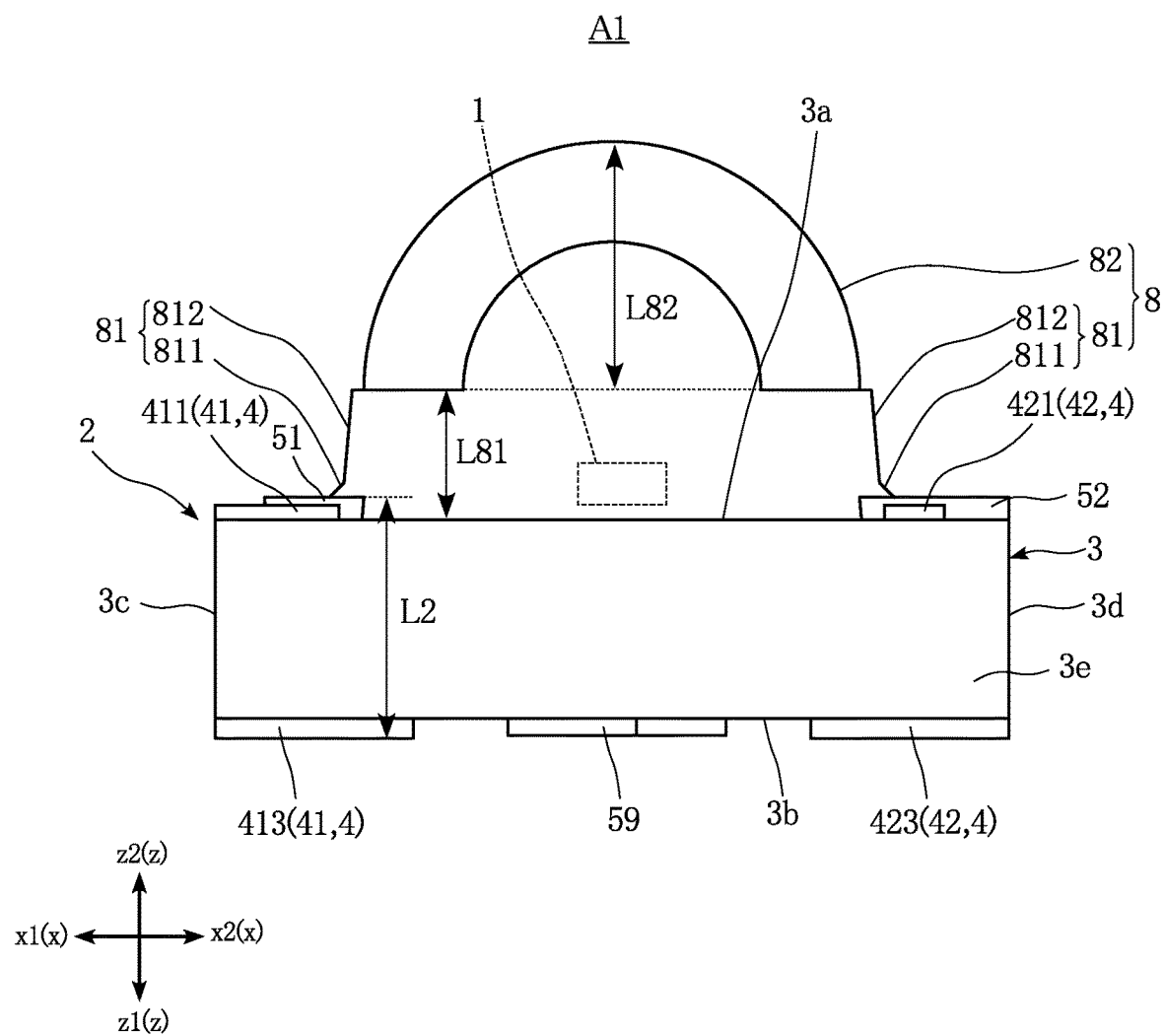
FIG. 1 is a front view of a light-emitting device according to a first embodiment.

The following describes embodiments of light-emitting devices and display apparatuses according to the present disclosure with reference to the accompanying drawings.

FIGS. 1 to 12 are views of a light-emitting device according to a first embodiment. The light-emitting device A1 of the first embodiment includes a light-emitting element 1, a supporting member 2 (a base 3, a wiring pattern 4 and a resist layer 5), a wire 6, a bonding layer 7 and a light-transmitting resin 8. For the purpose of description, FIGS. 1 to 12 define three directions perpendicular to each other as x, y and z directions. The z direction corresponds to the thickness direction of the light-emitting device A1. The x direction corresponds to the lateral direction in plan view of the light-emitting device A1 (see FIG. 4). The y direction corresponds to the vertical direction in plan view of the light-emitting device A1 (see FIG. 4). When necessary, one side in the x direction may be referred to as an x1 direction, and the other as an x2 direction. Likewise, one side in the y direction may be referred to as a y1 direction, and the other as a y2 direction. Also, one side in the z direction is referred to as a z1 direction, and the other as a z2 direction.

Figure 2:
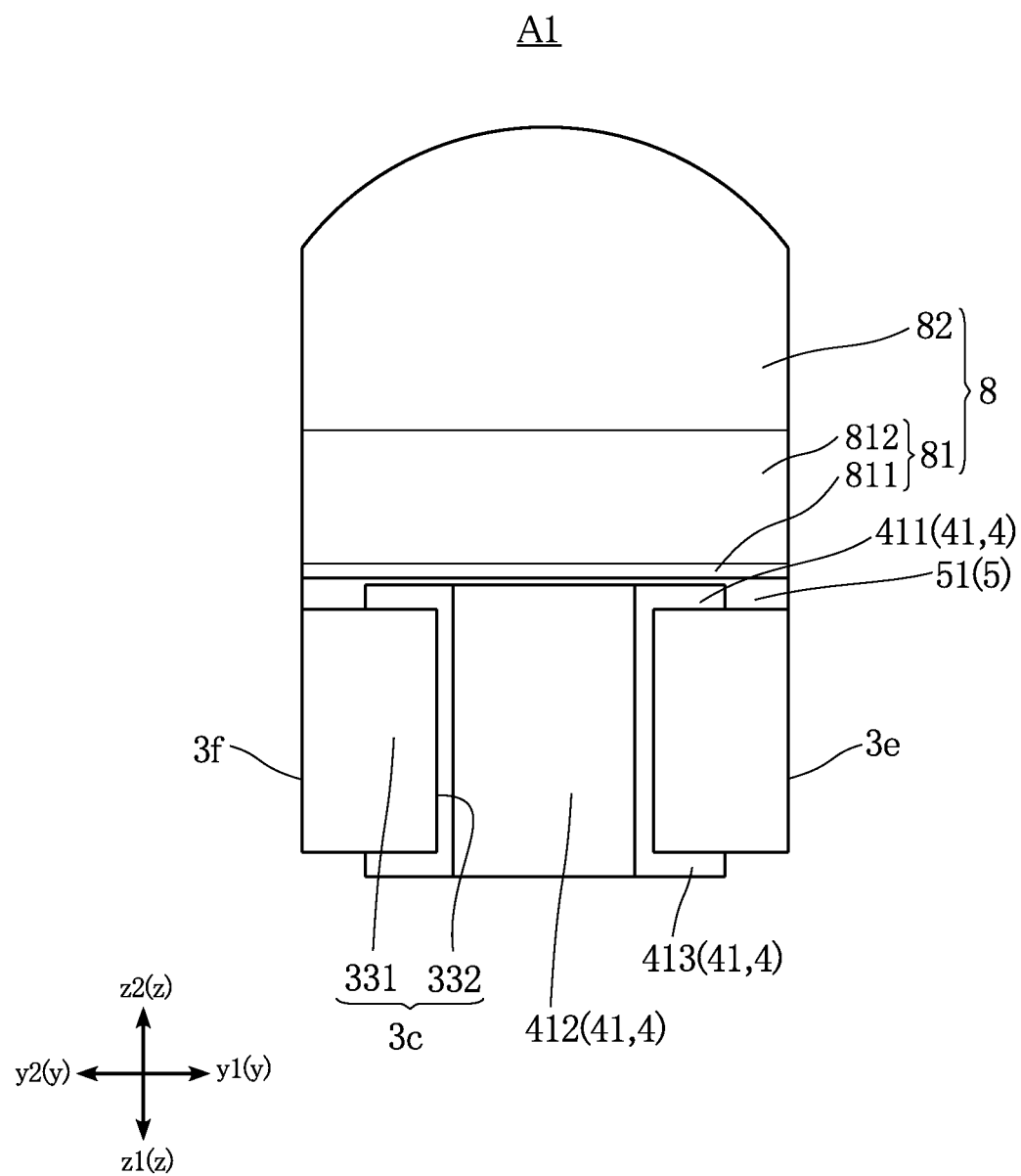
FIG. 2 is a side view (from the left) of the light-emitting device according to the first embodiment.
Figure 3:
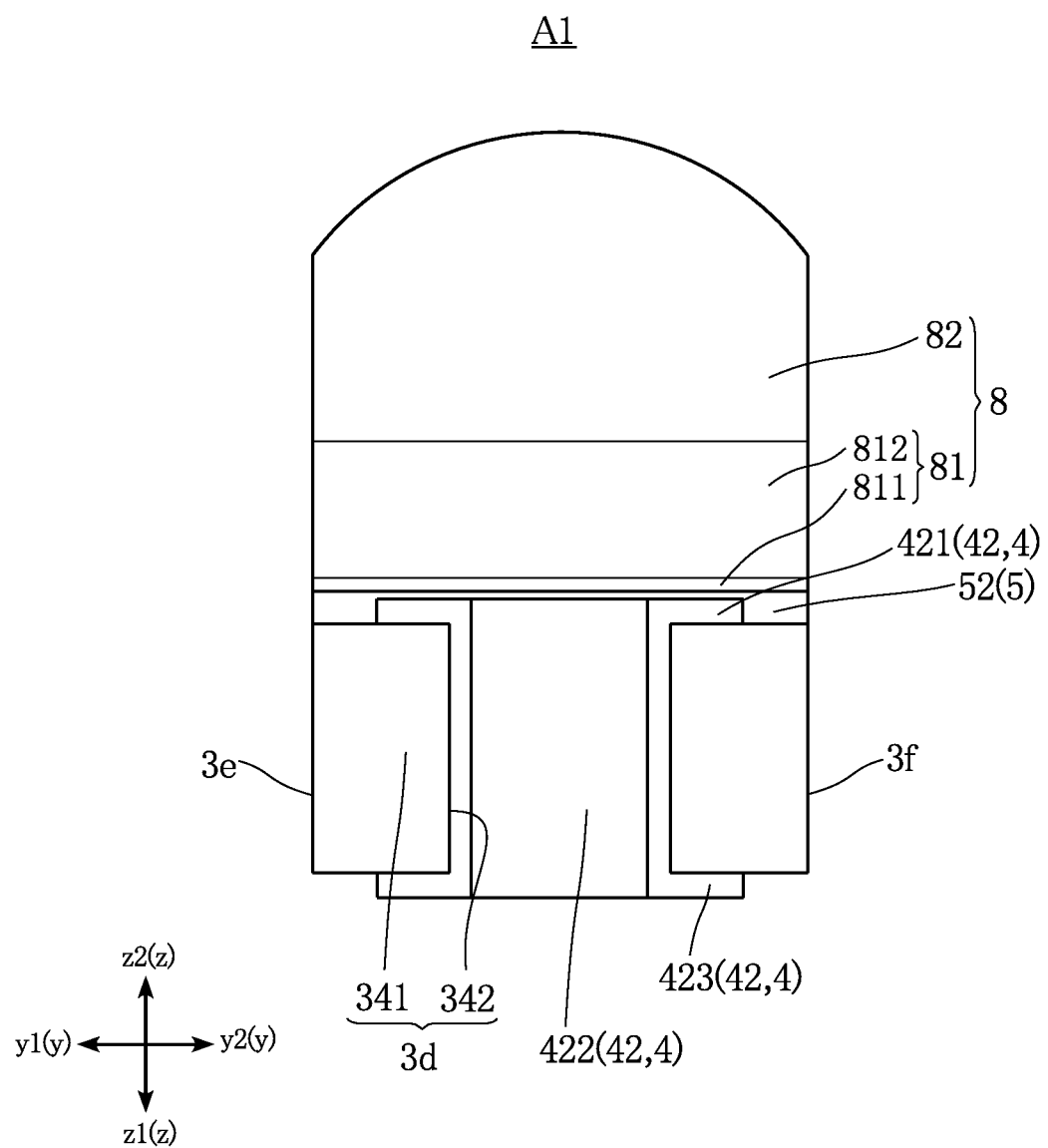
FIG. 3 is a side view (from the right) of the light-emitting device according to the first embodiment.
Figure 4:
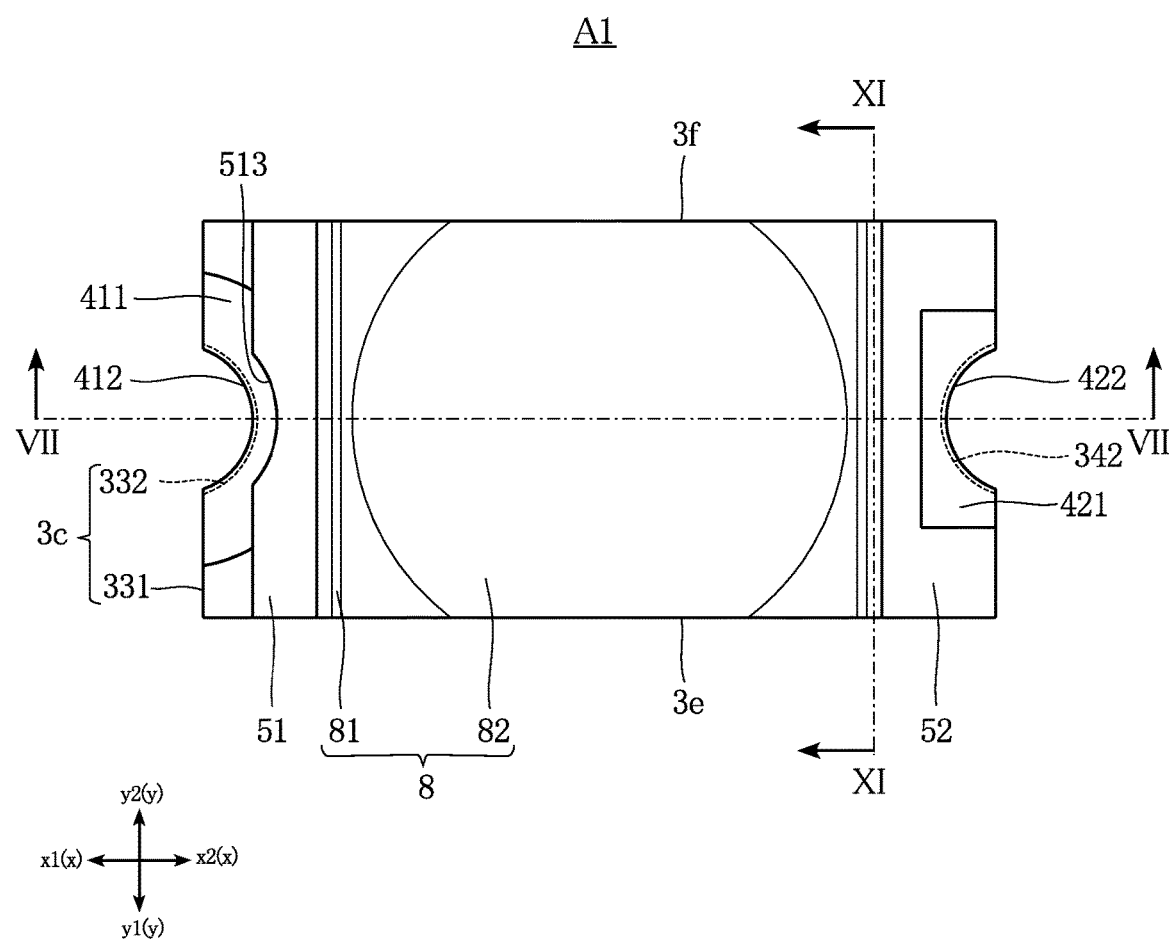
FIG. 4 is a plan view of the light-emitting device according to the first embodiment.
Figure 5:
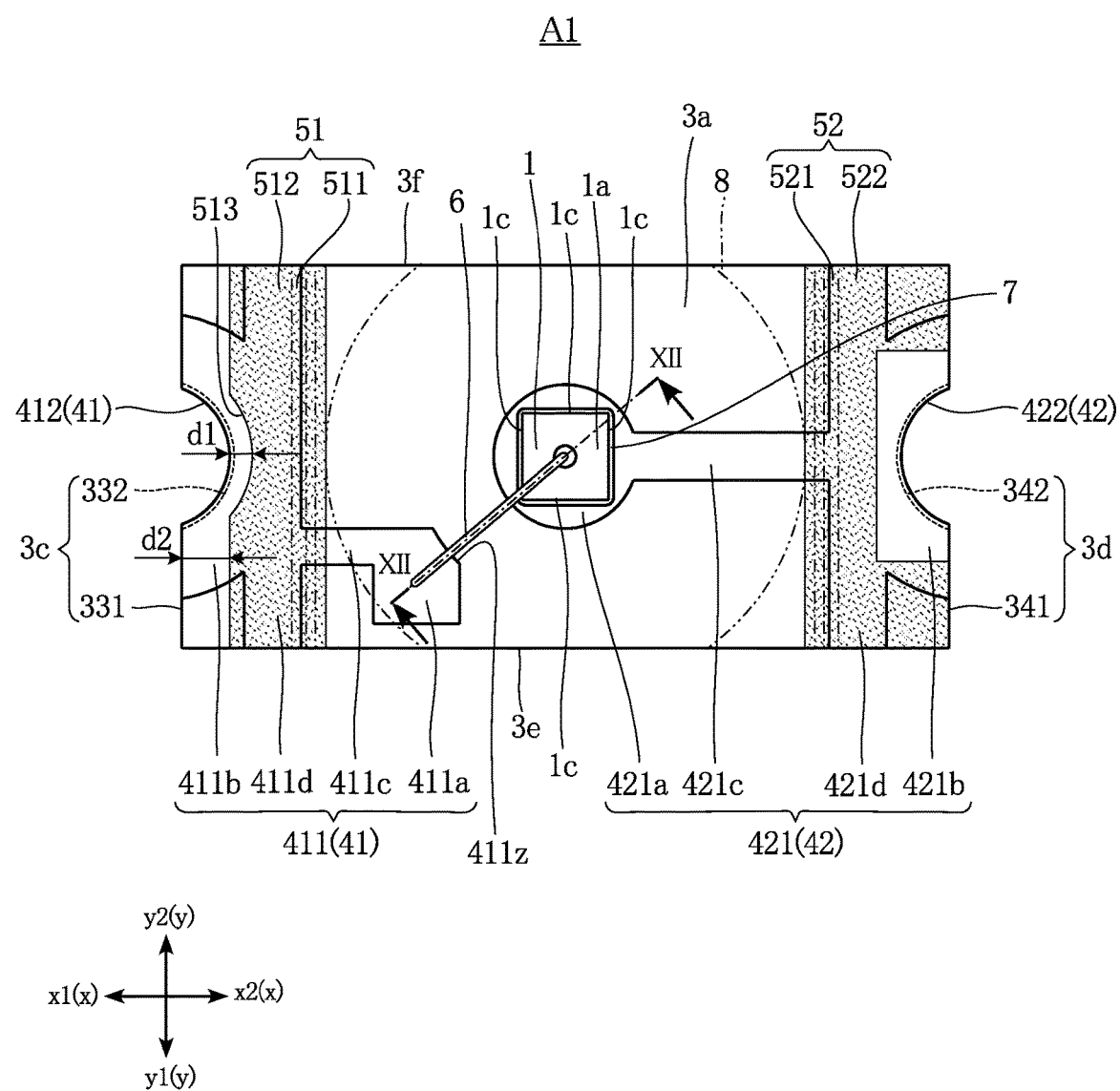
FIG. 5 is a plan view corresponding to FIG. 4 but omitting a light-transmitting resin.
Figure 6:
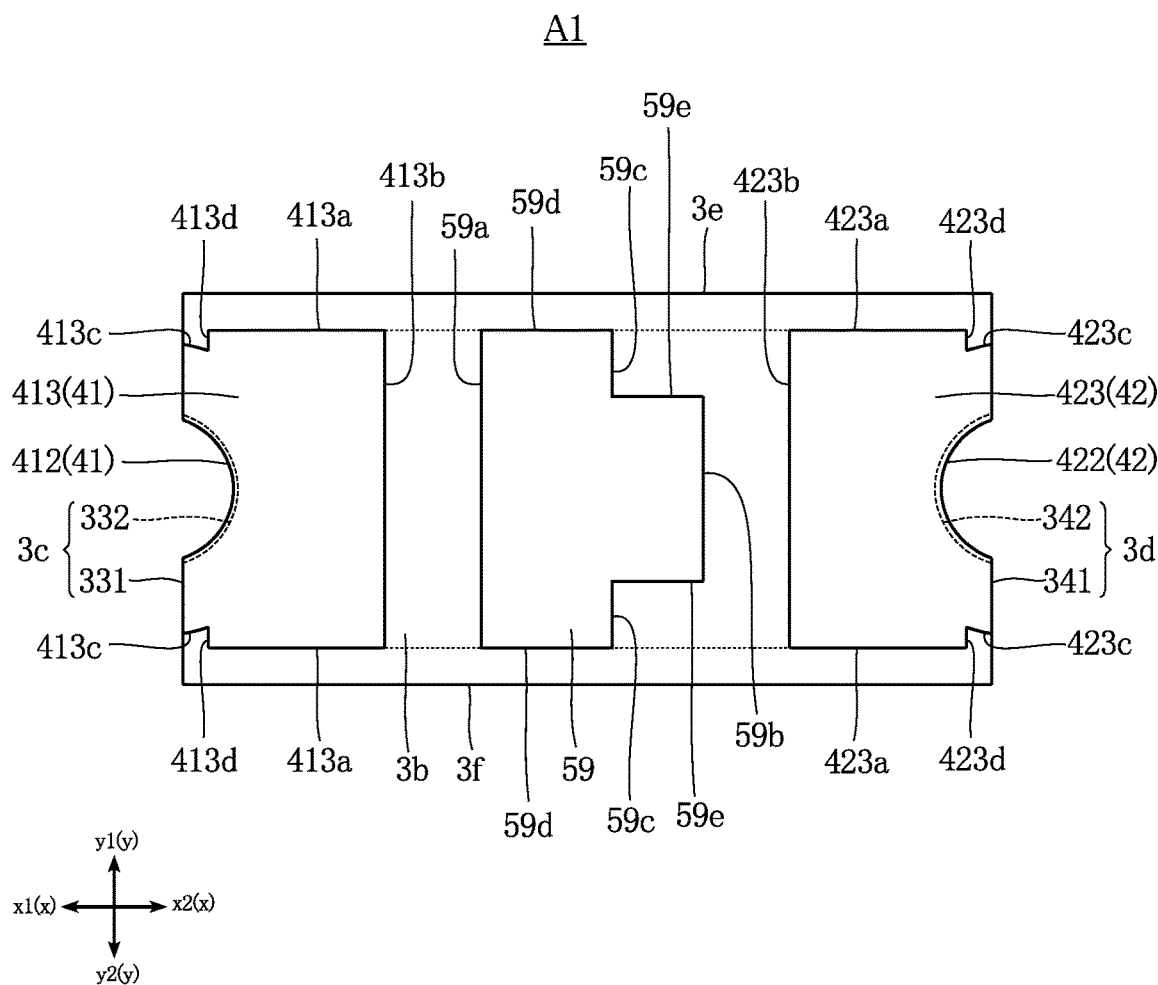
FIG. 6 is a bottom view of the light-emitting device according to the first embodiment.
Figure 7:
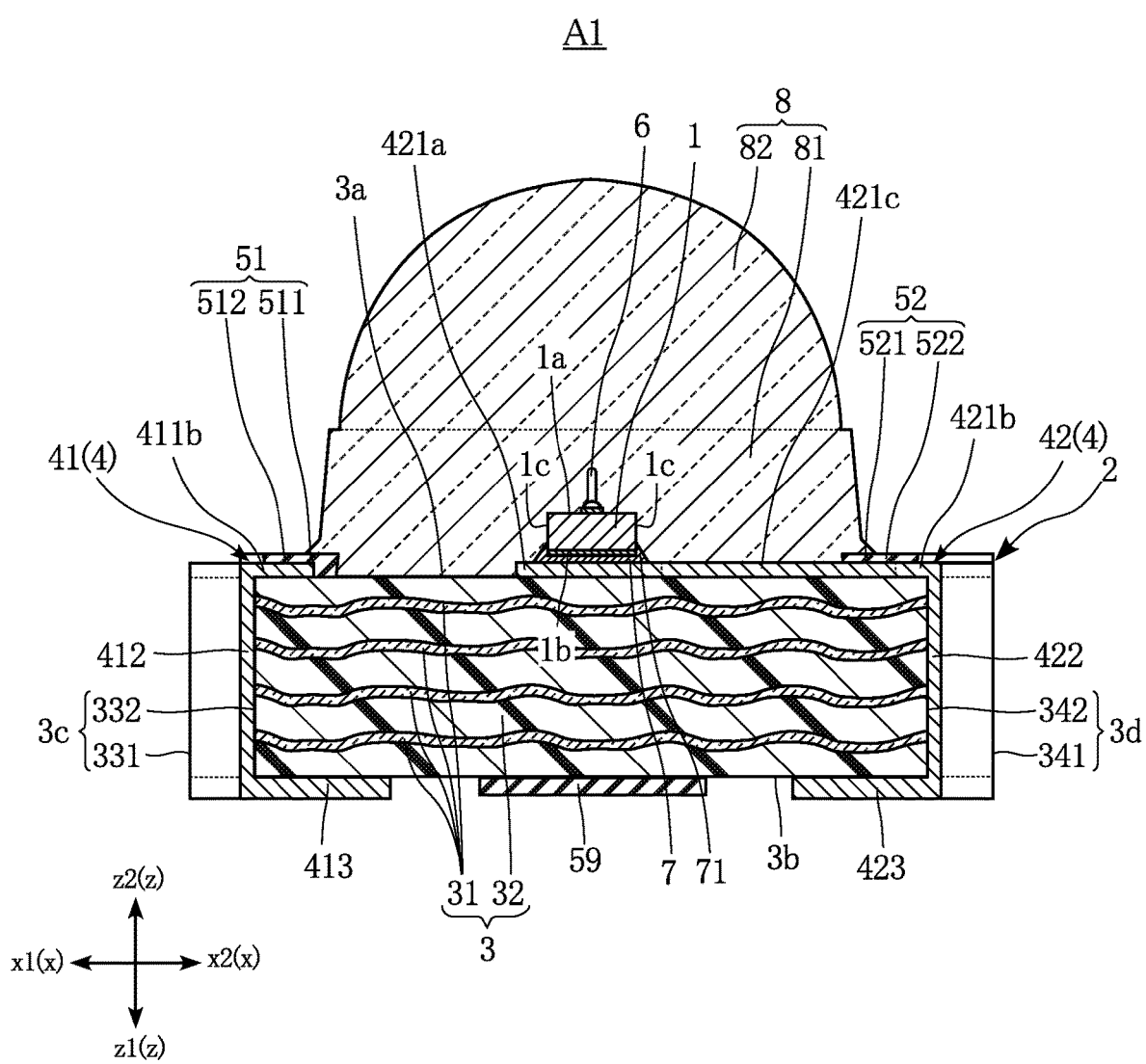
FIG. 7 is a sectional view taken along line VII-VII of FIG. 4.
Figure 8:
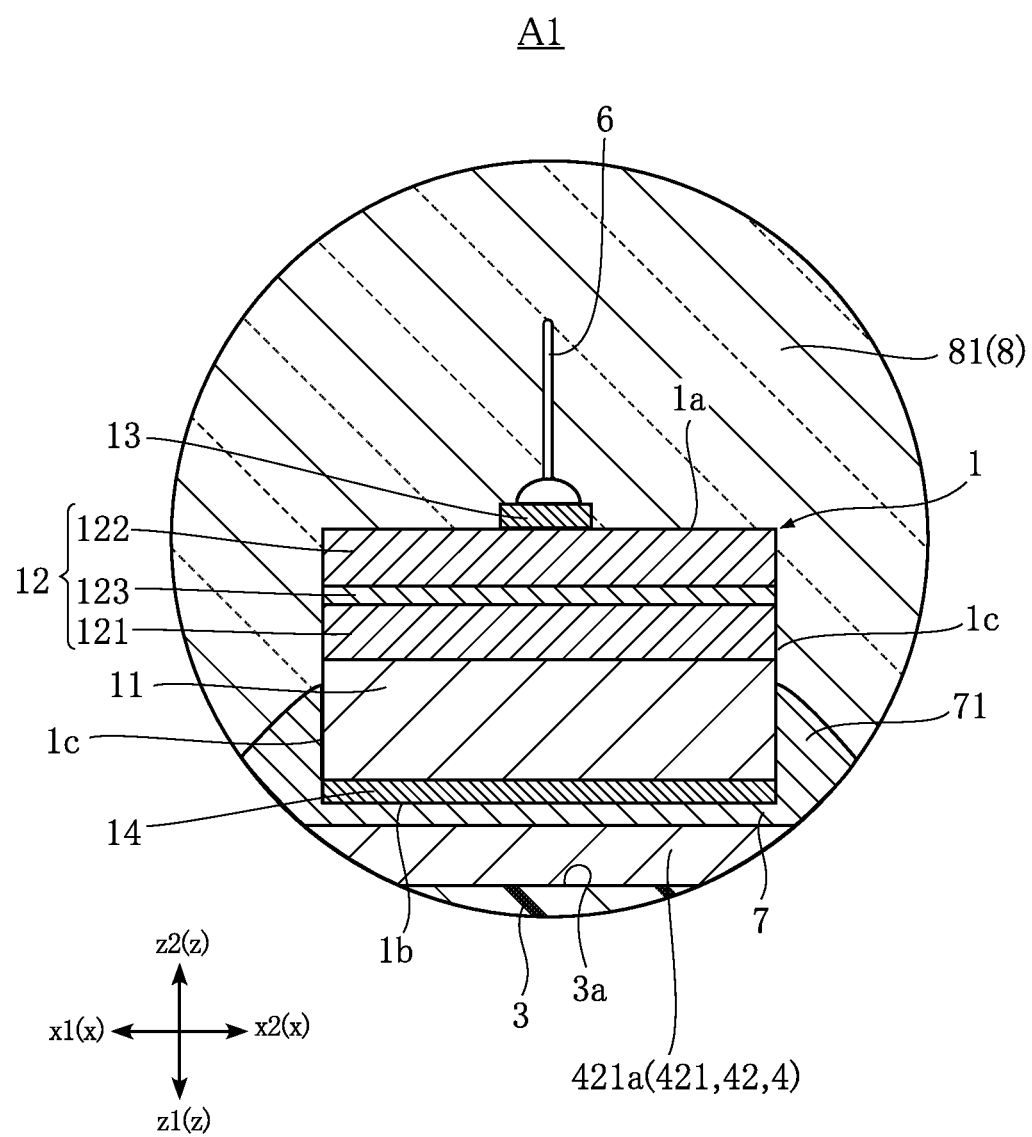
FIG. 8 is a fragmentary enlarged sectional view of FIG. 7, showing the cross-sectional structure of a light-emitting element.
Figure 9:
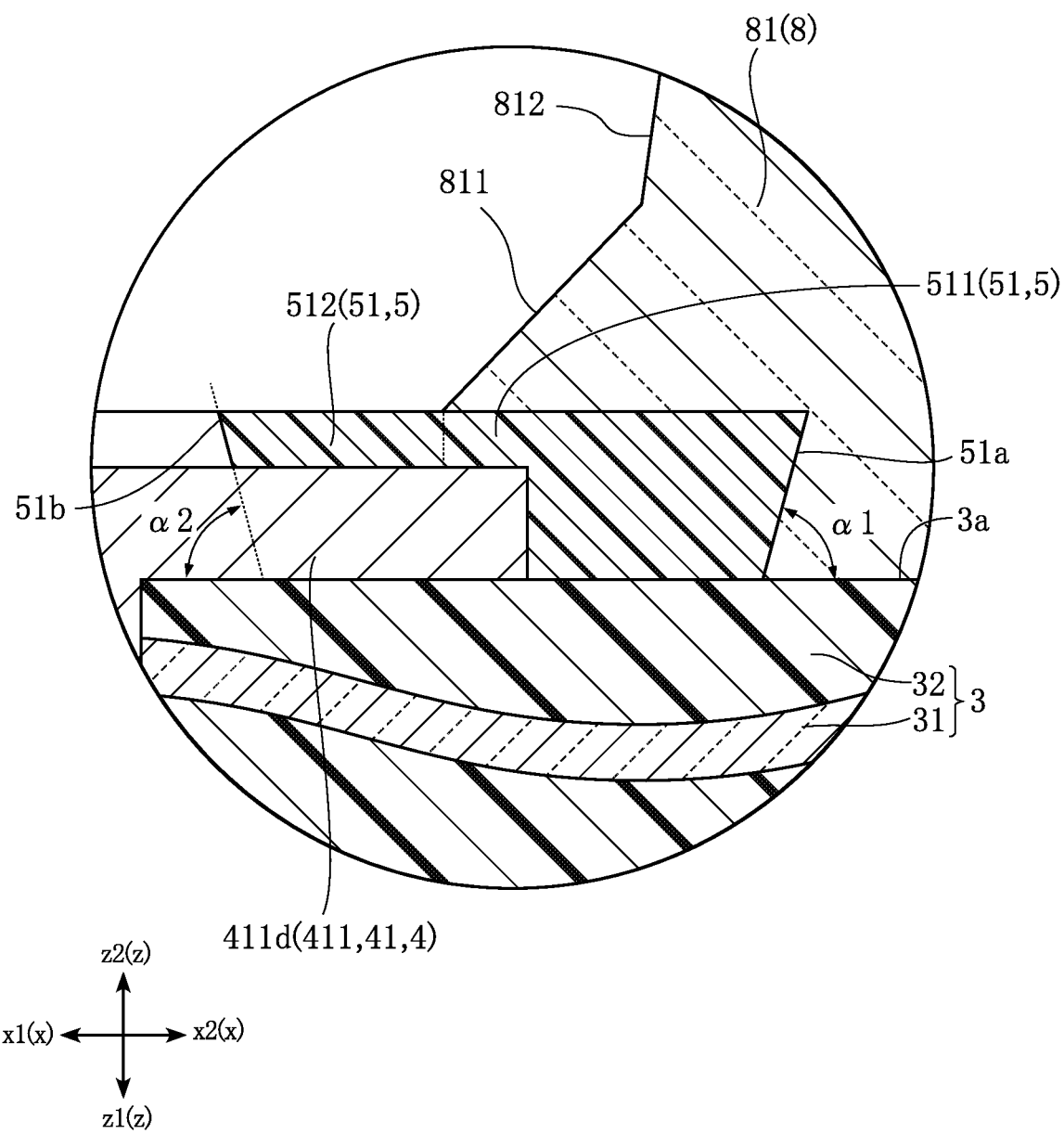
FIG. 9 is a fragmentary enlarged sectional view of FIG. 7.
Figure 10:
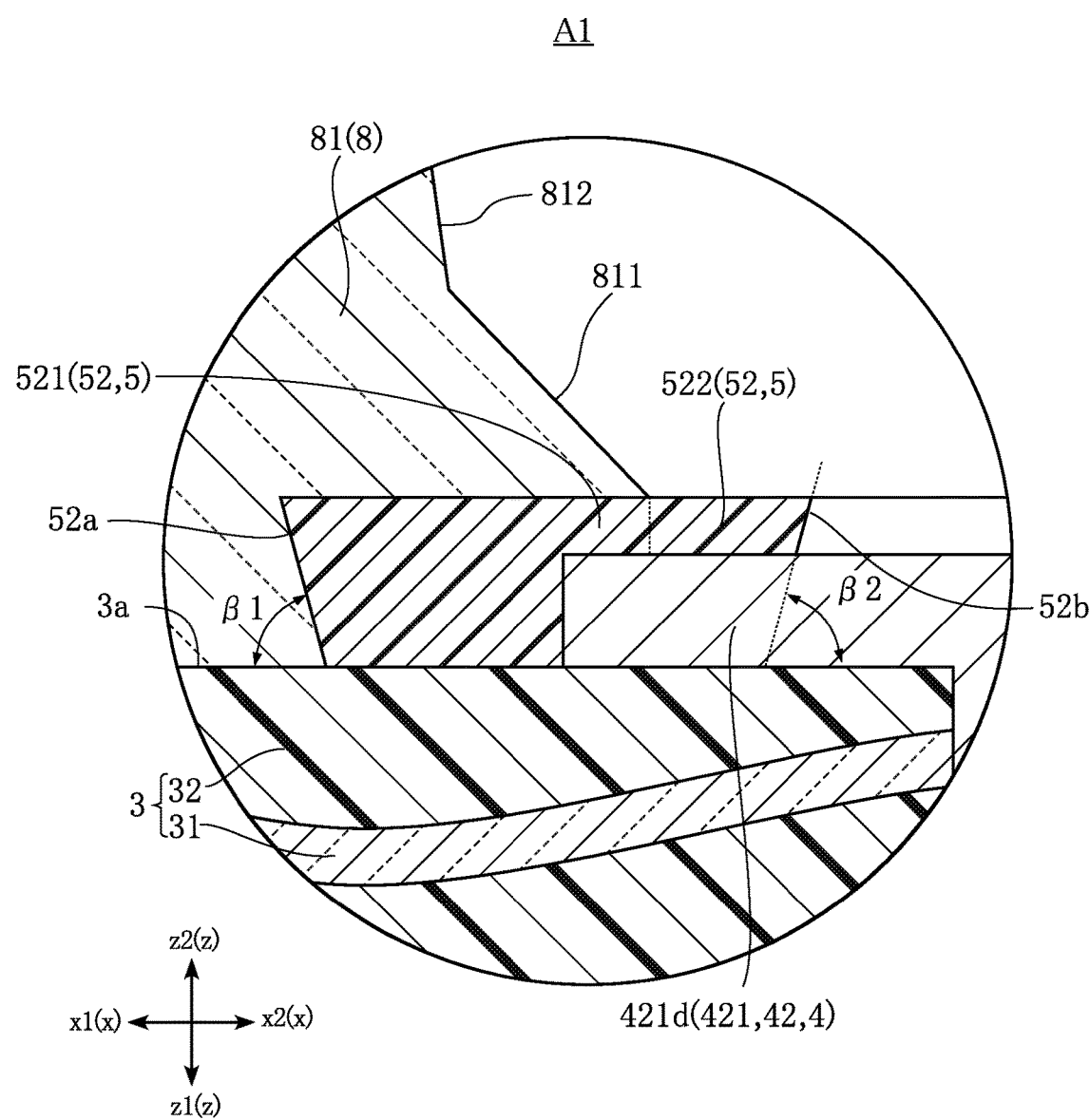
FIG. 10 is a fragmentary enlarged sectional view of FIG. 7.
Figure 11:
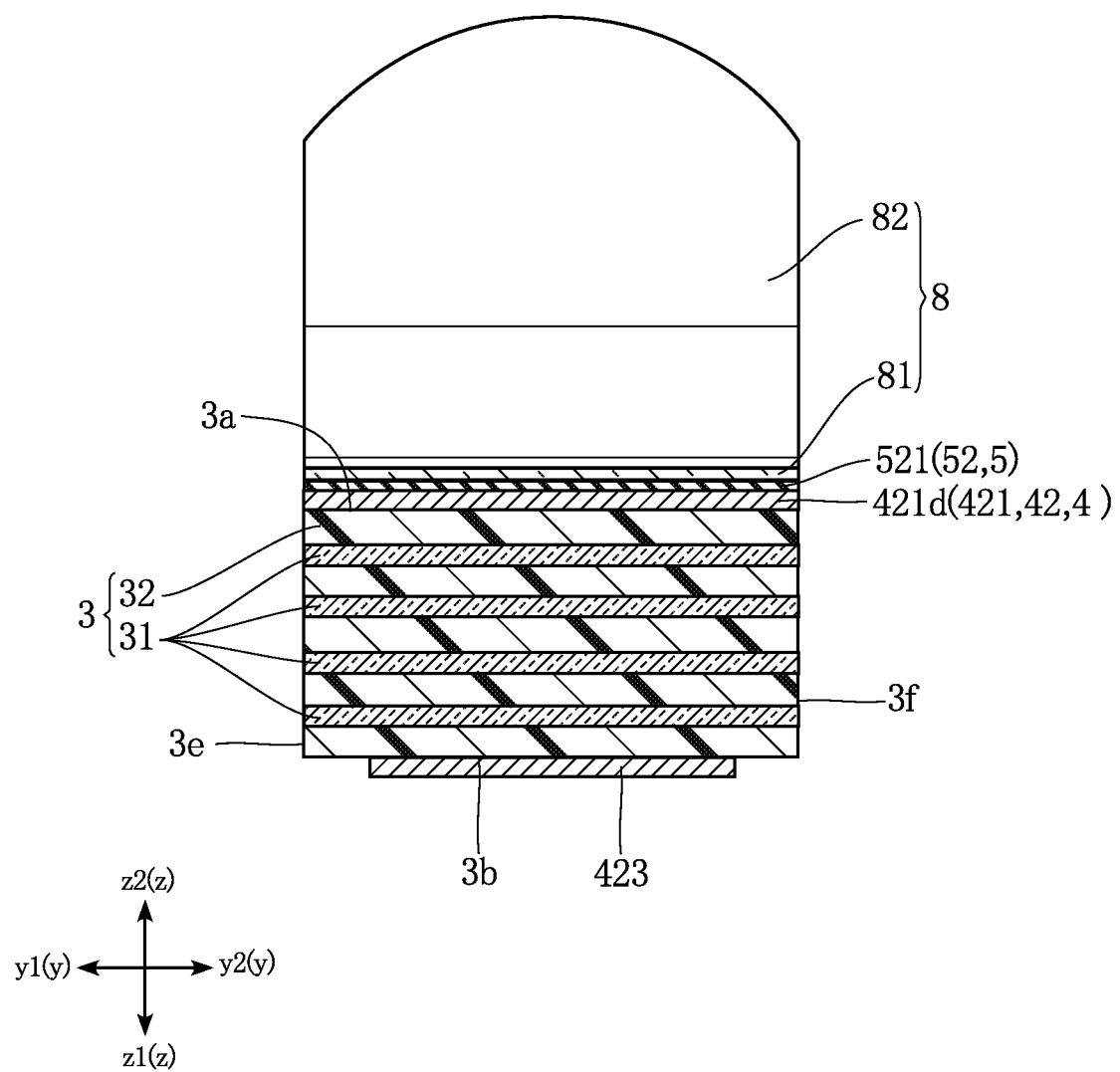
FIG. 11 is a sectional view taken along line XI-XI of FIG. 4.
Figure 12:
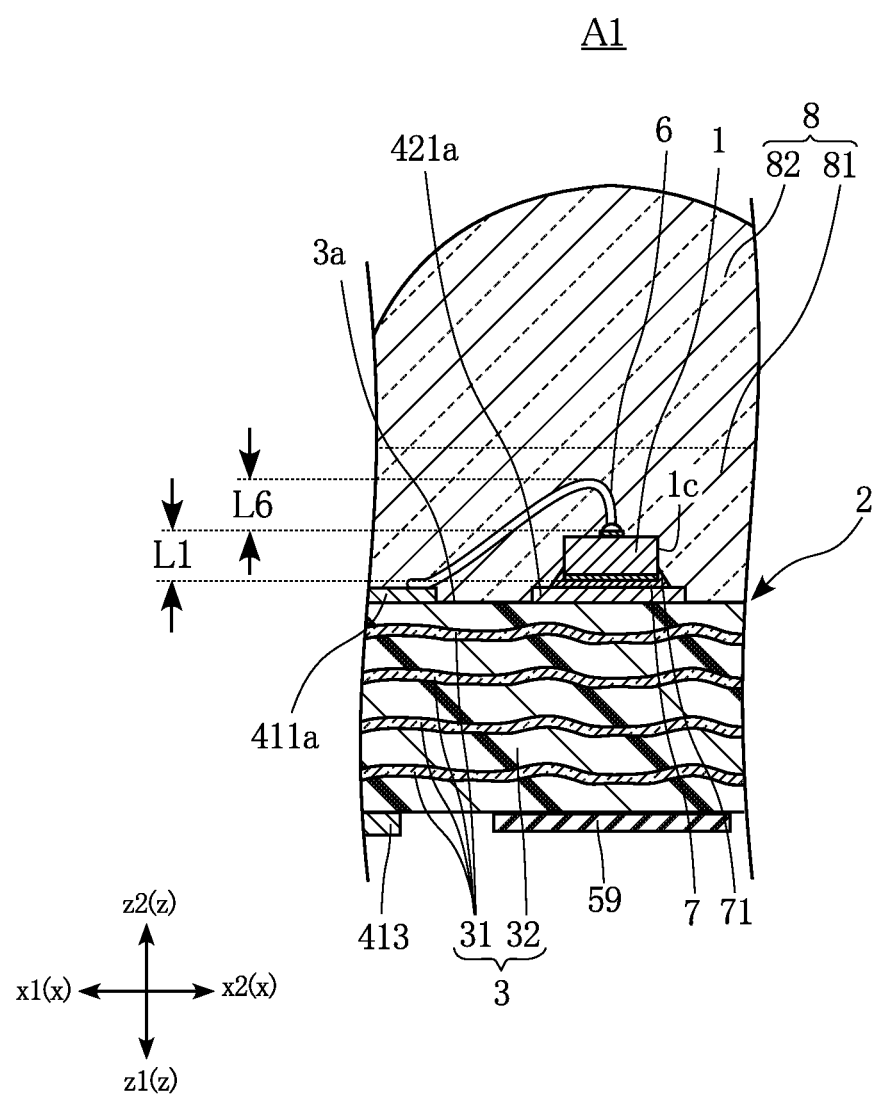
FIG. 12 is a sectional view taken along line XII-XII of FIG. 5.

FIG. 1 is a front view of the light-emitting device A1. FIG. 2 is a left side view of the light-emitting device A1, looking in the x2 direction. FIG. 3 is a right side view of the light-emitting device A1, looking in the x1 direction. FIG. 4 is a plan view of the light-emitting device A1. FIG. 5 is a plan view corresponding to FIG. 4 but omitting the light-transmitting resin 8. In FIG. 5, the light-transmitting resin 8 is indicated by phantom lines (chain double-dashed lines), and the resist layer 5 is shown transparent. FIG. 6 is a bottom view of the light-emitting device A1. FIG. 7 is a sectional view taken along line VII-VII of FIG. 4. FIG. 8 is a fragmentary enlarged sectional view of FIG. 7, showing the cross-sectional structure of the light-emitting element 1. The cross-sectional structure of the light-emitting element 1 shown in FIG. 8 is in schematic form and may not be precise in the relative sizes of the components. FIG. 9 is a fragmentary enlarged sectional view of FIG. 7. FIG. 10 is a fragmentary enlarged sectional view of FIG. 7. FIG. 11 is a sectional view taken along line XI-XI of FIG. 4. FIG. 12 is a sectional view taken along line XII-XII of FIG. 5.

The light-emitting device A1 is designed for surface mounting on a mounting substrate of an electronic device, a display apparatus, or the like. As viewed in the z direction (or simply in "plan view"), the light-emitting device A1 is rectangular having the long side in the x direction and the short side in the y direction. In the present embodiment, the light-emitting device A1 has an x-direction dimension of about 1.6 mm and a y-direction dimension of about 0.8 mm.

The light-emitting element 1 is an electronic component for use as a light source of the light-emitting device A1. In the present embodiment, the light-emitting element 1 is a so-called LED chip. The light-emitting element 1 is rectangular in plan view. In the present embodiment, the light-emitting element 1 is about 0.15 to 0.31 mm in both x- and y-direction dimensions. In the z-direction dimension (L1 shown in FIG. 12), the light-emitting element 1 is about 0.06 to 0.20 mm.

The light-emitting element 1 has an element front surface 1a, an element back surface 1b and a plurality of element side surfaces 1c. The element front surface 1a and the element back surface 1b are spaced apart and face away from each other in the z direction. The element side surface 1c are located between and connect the element front surface 1a and the element back surface 1b. In the present embodiment, the element side surfaces 1c of the light-emitting element 1 include one pair spaced apart and face away from each other in the x direction and another pair spaced apart and face away from each other in the y direction.

In the present embodiment, as shown in FIG. 8, the light-emitting element 1 includes an element substrate 11 made of a semiconductor material and a plurality of semiconductor layers 12 laminated on the element substrate 11. The semiconductor layers 12 may include an n-type semiconductor layer 121, a p-type semiconductor layer 122 and a light-emitting layer 123. In the present embodiment, the n-type semiconductor layer 121 is formed on the element substrate 11, the light-emitting layer 123 is formed on the n-type semiconductor layer 121, and the p-type semiconductor layer 122 is formed on the light-emitting layer 123. That is, the light-emitting layer 123 is sandwiched between the n-type semiconductor layer 121 and the p-type semiconductor layer 122. Examples of the semiconductor material for the element substrate 11 include gallium arsenide (GaAs) and silicon (Si). The z-direction dimension L1 of the light-emitting element 1 can be adjusted by changing the z-direction dimension of the element substrate 11.

The light-emitting element 1 includes a first electrode 13 and a second electrode 14. The first electrode 13 and the second electrode 14 may respectively be an anode and a cathode, or vice versa, of the light-emitting element 1. In the present embodiment, the first electrode 13 is exposed on the element front surface 1a. The first electrode 13 is a front surface electrode of the light-emitting element 1. The second electrode 14 is disposed on the element back surface 1b. The second electrode 14 is a back surface electrode of the light-emitting element 1. The first electrode 13 and the second electrode 14 are formed with a metal layer, which may be, but not limited to, a laminate of a gold (Au) layer on a titanium (Ti) layer.

The supporting member 2 supports the light-emitting element 1 and the light-transmitting resin 8. The supporting member 2 is rectangular in plan view. The supporting member 2 has an x-direction dimension of about 1.6 mm and a y-direction dimension of about 0.8 mm. Also, the supporting member 2 has a z-direction dimension (L2 shown in FIG. 1) of about 0.4 to 0.6 mm. In the present embodiment, the supporting member 2 includes the base 3, the wiring pattern 4 and the resist layer 5.

The base 3 is the foundation of the supporting member 2 and made of an insulating material. In the present embodiment, the base 3 includes glass cloths 31 laminated in the z direction and impregnated with an impregnated resin 32. The glass cloth 31 is glass fiber woven into fabric. The impregnated resin 32 includes an epoxy resin or an acyclic resin. The acyclic resin may be a polymethyl methacrylate resin. In the present embodiment, the glass cloth 31 is a laminate of four layers. In the present embodiment, the base 3 has a z-direction dimension of about 0.3 to 0.5 mm. The z-direction dimension of the base 3 may be adjusted by, for example, changing the number of layers of the glass cloth 31. The size of the supporting member 2 (each of the x-, y- and z-direction dimensions) is determined largely by the size of the base 3.

As shown in FIGS. 5 and 6, the base 3 has a base front surface 3a, a base back surface 3b and a plurality of base side surfaces 3c to 3f. The base front surface 3a and the base back surface 3b are spaced apart and face away from each other in the z direction. The base front surface 3a faces the light-emitting element 1 (element back surface 1b). The base side surfaces 3c to 3f are located between and connect the base front surface 3a and the base back surface 3b. In the present embodiment, each of the base side surfaces 3c to 3f is connected to the base front surface 3a at the edge in the z1 direction and to the base back surface 3b at the edge in the z2 direction. The base side surfaces 3c and 3d are spaced apart and face away from each other in the x direction. In the present embodiment, the base side surface 3c faces in the x1 direction, and the base side surface 3d in the x2 direction. The base side surfaces 3e and 3f are spaced apart and face away from each other in the y direction. In the present embodiment, the base side surface 3e faces in the y1 direction, and the base side surface 3f in the y2 direction.

As shown in FIGS. 2 and 5 to 7, the base side surface 3c has a first flat portion 331 and a first recessed portion 332. The first flat portion 331 is a flat region of the base side surface 3c. The first recessed portion 332 is recessed from the first flat portion 331 of the base side surface 3c to the inner side of the base 3. The first recessed portion 332 is substantially semicircular in plan view. The first recessed portion 332 extends from the base front surface 3a to the base back surface 3b, penetrating the base 3 in the z direction. In one example, the first recessed portion 332 is formed by the following process. First, a through hole is formed to penetrate a plate-like base 3 in the z direction. The through hole is circular in plan view. Then, the base 3 is cut along a line passing through the through hole. This forms the first recessed portion 332 having a substantially semicircular shape in plan view. The process of forming the first recessed portion 332 is not limited to this.

As shown in FIGS. 3 and 5 to 7, the base side surface 3d has a second flat portion 341 and a second recessed portion 342. The second flat portion 341 is a flat region of the base side surface 3d. The second recessed portion 342 is recessed from the second flat portion 341 of the base side surface 3d to the inner side of the base 3. The second recessed portion 342 is substantially semicircular in plan view. The second recessed portion 342 extends from the base front surface 3a to the base back surface 3b, penetrating the base 3 in the z direction. The second recessed portion 342 may be formed by the same process as the first recessed portion 332.

The wiring pattern 4 provides a current path for supplying electric power to the light-emitting element 1. The wiring pattern 4 is electrically connected to the light-emitting element 1. The wiring pattern 4 is formed on the base 3. The wiring pattern 4 is made of one or more of metals, such as Cu, Ni, Ti and Au. In the present embodiment, the wiring pattern 4 is made of Cu, Ni and Au deposited on the base 3 in the stated order. The materials of the wiring pattern 4, however, are not limited to these. The wiring pattern 4 may be formed by for example plating, although the formation method is not limited to this. The wiring pattern 4 includes a first wiring 41 and a second wiring 42. The first wiring 41 and the second wiring 42 are spaced apart from each other.

The first wiring 41 is a segment of the wiring pattern 4 and electrically connected to the first electrode 13 of the light-emitting element 1. The first wiring 41 has a first front-surface portion 411, a first side portion 412 and a first back-surface portion 413.

The first front-surface portion 411 of the first wiring 41 is formed on and in contact with a portion of the base front surface 3a. The first front-surface portion 411 includes a wire bonding portion 411a, a first edge portion 411b, a first connecting portion 411c and a first extending portion 411d.

The shapes and layout of the portions of the first front-surface portion 411 are not limited to those shown in the figures. In the illustrated example, the first extending portion 411d may be considered as being an elongated rectangular strip extending in the y direction, while the first edge portion 411b (which is adjacent to the base side surface 3c) and the first connecting portion 411c (which is opposite to the first edge portion 411b with respect to the first extending portion 411d) may be directly connected to the first extending portion 411d.

The wire bonding portion 411a is where one end of the wire 6 is to be bonded. As illustrated in FIG. 5, the wire bonding portion 411a may be rectangular in plan view, with one corner thereof being cut away. Thus, the wire bonding portion 411a has a first opposing edge 411z. The first opposing edge 411z faces a portion of the second wiring 42 (specifically, the peripheral edge of a die bonding portion 421a of a second front-surface portion 421, which will be described later). The first opposing edge 411z is a predetermined distance away from the peripheral edge of the die bonding portion 421a.

The first edge portion 411b covers a region of the base front surface 3a along the first recessed portion 332 (in other words, a region connected to and near the first recessed portion 332). In the present embodiment, the first edge portion 411b has a generally semi-annular shape in plan view. A region of the first edge portion 411b is exposed from the resist layer 5 (a first insulating film 51, which will be described later).

The first connecting portion 411c connects the wire bonding portion 411a and the first edge portion 411b to each other. In plan view, the first connecting portion 411c has a strip shape extending linearly in the x direction. The shape and layout of the first connecting portion 411c are not limited to those shown in the figures.

The first extending portion 411d extends, relative to the first connecting portion 411c, to one edge of the base front surface 3a (e.g., the lower horizontal edge in FIG. 5) in the y direction and also to the other edge of the base front surface 3a (e.g., the upper horizontal edge in FIG. 5) in the opposite direction. Thus, the first extending portion 411d extends across the base front surface 3a, bridging between the two edges (which may be parallel) spaced apart from each other in the y direction. In the present embodiment, the first extending portion 411d is formed integral with the first connecting portion 411c and the first edge portion 411b. Without limitation, the first extending portion 411d has a flat surface facing in the z2 direction.

The first side portion 412 of the first wiring 41 is formed on and in contact with a portion of the base side surface 3c. For instance, the first side portion 412 may partially or entirely cover the first recessed portion 332 of the base side surface 3c. In the illustrated example, the first side portion 412 is in contact with the entirety of the first recessed portion 332 of the base side surface 3c. The first side portion 412 is connected to the first front-surface portion 411 (the first edge portion 411b) and the first back-surface portion 413. The first side portion 412 may be formed in the following manner, for example. To form the first recessed portion 332, the base is cut along a line passing through the through hole (corresponding to the resulting recessed portion 332). Before this cutting, plating is performed to cover the entire surface of the through hole. Then, the base 3 is cut along the above-noted line, and the metal film produced by the plating forms into the first side portion 412 covering the first recessed portion 332.

The first back-surface portion 413 of the first wiring 41 is formed on and in contact with a portion of the base back surface 3b. When the light-emitting device A1 is attached to, for example, a mounting substrate, the first back-surface portion 413 is where a joint is made. The first back-surface portion 413 is connected to the first side portion 412. The first back-surface portion 413 is electrically connected to the first electrode 13 of the light-emitting element 1 via the first side portion 412, the first front-surface portion 411 (the first edge portion 411b, the first connecting portion 411c and the wire bonding portion 411a) and the wire 6. As shown in FIG. 6, the edges of the first back-surface portion 413 in the y direction are located inside the edges of the base back surface 3b in plan view. The first back-surface portion 413 has an edge formed along the peripheral edge of the first recessed portion 332 of the base back surface 3b in plan view.

As shown in FIG. 6, the first back-surface portion 413 has a plurality of boundary edges 413a to 413d in plan view. The boundary edges 413a are provided in a pair spaced apart from each other in the y direction. As shown in FIG. 6, each boundary edge 413a of the present embodiment is straight in the x direction, although it may be inclined relative to the x direction or even curved in other embodiments. The boundary edge 413b is located between and connects the pair of boundary edges 413a. In the embodiment shown in FIG. 6, the boundary edge 413b is straight in the y direction, although it may be inclined relative to the y direction or even curved. The boundary edge 413b is connected at the end in the y1 direction to the end in the x2 direction of the boundary edge 413a located in the y1 direction, and also connected at the end in the y2 direction to the end in the x2 direction of the boundary edge 413a located in the y2 direction. The boundary edges 413c are provided in a pair spaced apart from each other in the y direction. Each boundary edge 413c is curved along the first recessed portion 332 of the base side surface 3c in plan view. In plan view, each boundary edge 413c starts from a point on the base side surface 3c and meets a boundary edge 413d. The boundary edges 413d are provided in a pair spaced apart from each other in the y direction. The boundary edge 413d located in the y1 direction meets the boundary edge 413a and the boundary edge 413c both located in the y1 direction. The boundary edge 413d located in the y2 direction meets the boundary edge 413a and the boundary edge 413c both located in the y2 direction. In the present embodiment, the boundary edges 413d are substantially perpendicular to the boundary edges 413a.

The second wiring 42 is a segment of the wiring pattern 4 and electrically connected to the second electrode 14 of the light-emitting element 1. The second wiring 42 is electrically connected to the second electrode 14 of the light-emitting element 1. The second wiring 42 has a second front-surface portion 421, a second side portion 422 and a second back-surface portion 423.

The second front-surface portion 421 of the second wiring 42 is formed on and in contact with a portion of the base front surface 3a. The second front-surface portion 421 includes a die bonding portion 421a, a second edge portion 421b, a second connecting portion 421c and a second extending portion 421d. The shapes and layout of the portions of the second front-surface portion 421 are not limited to those shown in the figures.

The die bonding portion 421a supports the light-emitting element 1. The die bonding portion 421a is bonded to the light-emitting element 1 via the bonding layer 7. The die bonding portion 421a faces the element back surface 1b of the light-emitting element 1. The die bonding portion 421a is electrically connected to the second electrode 14 via the bonding layer 7. As shown in FIG. 5, the die bonding portion 421a of this embodiment is circular in plan view. However, the shape of the die bonding portion 421a in plan view is not limited to circular and may alternatively be rectangular or polygonal.

The second edge portion 421b covers a region of the base front surface 3a connected to and near the second recessed portion 342. In the present embodiment, the second edge portion 421b has a semi-annular shape in plan view.

The second connecting portion 421c connects the die bonding portion 421a and the second edge portion 421b. In plan view, the second connecting portion 421c has a strip shape extending substantially linearly in the x direction. In the present embodiment, the second connecting portion 421c is located in the middle of the base front surface 3a in the y direction in plan view. The second connecting portion 421c is offset from the first connecting portion 411c as viewed in the x direction.

The second extending portion 421d extends across the base front surface 3a to bridge between the two edges of the surface 3a that are spaced apart in the y direction. In the present embodiment, the second extending portion 421d is connected to the second edge portion 421b and the second connecting portion 421c. The second extending portion 421d has a flat surface facing in the z2 direction.

The second side portion 422 of the second wiring 42 is formed on and in contact with a portion of the base side surface 3d. In the present embodiment, the second side portion 422 is in contact with the entire second recessed portion 342 of the base side surface 3d. That is, the second recessed portion 342 is covered by the second side portion 422. The second side portion 422 is connected to the second front-surface portion 421 (the second edge portion 421b) and the second back-surface portion 423. The second side portion 422 may be formed in the same manner as noted above with the first side portion 412. Specifically, before cutting the base 3 along a line passing through the through hole (corresponding to the second side portion 422), plating is performed to cover the entire surface of the through hole. The base 3 is cut along the line, and then the metal film from the plating forms into the second side portion 422 covering the second recessed portion 342.

The second back-surface portion 423 of the second wiring 42 is formed on and in contact with a portion of the base back surface 3b. The second back-surface portion 423 is spaced apart from the first back-surface portion 413. When the light-emitting device A1 is attached to, for example, a mounting substrate, the second back-surface portion 423 is where a joint is made. The second back-surface portion 423 is connected to the second side portion 422. The second back-surface portion 423 is electrically connected to the second electrode 14 of the light-emitting element 1 via the second side portion 422, the second front-surface portion 421 (the second edge portion 421b, the second connecting portion 421c and the die bonding portion 421a) and the bonding layer 7. As shown in FIG. 6, the edges of the second back-surface portion 423 in the y direction are located inside the edges of the base back surface 3b in plan view. The second back-surface portion 423 has an edge formed along the edge of the second recessed portion 342 of the base back surface 3b in plan view.

As shown in FIG. 6, the second back-surface portion 423 has a plurality of boundary edges 423a to 423d in plan view. A pair of boundary edges 423a are spaced apart from each other in the y direction. In the embodiment shown in FIG. 6, each boundary edge 423a is straight in the x direction, although it may be inclined relative to the x direction or even curved. The boundary edge 423b is located between and connects the pair of boundary edges 423a. As shown in FIG. 6, the boundary edge 423b of the present embodiment is straight in the y direction, although it may be inclined relative to the y direction or even curved in other embodiments. The boundary edge 423b is connected at the end in the y1 direction to the end in the x1 direction of the boundary edge 423a located in the y1 direction, and also connected at the end in the y2 direction to the end in the x1 direction of the boundary edge 423a located in the y2 direction. The boundary edges 423c are provided in a pair spaced apart from each other in the y direction. Each boundary edge 423c is curved along the second recessed portion 342 of the base side surface 3d in plan view. In plan view, each boundary edge 423c starts from a point on the base side surface 3d and meets one of a pair of boundary edges 423d. The boundary edges 423d are provided in a pair spaced apart from each other in the y direction. The boundary edge 423d located in the y1 direction meets the boundary edge 423a and the boundary edge 423c both located in the y1 direction. The boundary edge 423d located in the y2 direction meets the boundary edge 423a and the boundary edge 423c located in the y2 direction. In the present embodiment, the boundary edges 423d are substantially perpendicular to the boundary edges 423a.

The resist layer 5 is made of an insulating material. The resist layer 5 includes a first insulating film 51, a second insulating film 52 and a polarity mark 59. The first insulating film 51 and the second insulating film 52 may be formed from a resist film. The first insulating film 51 and the second insulating film 52 are formed by applying a resist film by compression bonding and curing the thus applied resist film.

As shown in FIGS. 5, 7 and 9, the first insulating film 51 covers a portion of the first front-surface portion 411 of the first wiring 41 and a portion of the base front surface 3a. As shown in FIGS. 5, 7 and 9, the first insulating film 51 of the present embodiment includes a first interposed portion 511 and a first exposed portion 512.

The first interposed portion 511 is formed on the first extending portion 411d of the first insulating film 51 and covered by the light-transmitting resin 8. The first interposed portion 511 is interposed between the first extending portion 411d and the light-transmitting resin 8 in the z direction. The first interposed portion 511 is covered by the light-transmitting resin 8, with the end faces facing in the y direction left uncovered. As shown in FIG. 5, the first interposed portion 511 extends across the base front surface 3a, from the edge in the y1 direction to the edge in the y2 direction in plan view.

The first exposed portion 512 is formed on the first extending portion 411d of the first insulating film 51 and not covered by the light-transmitting resin 8. The first exposed portion 512 is connected to the first interposed portion 511 and located in the outward direction (x1 direction) from the first interposed portion 511. As shown in FIG. 5, the first exposed portion 512 extends across the base front surface 3a, from the edge in the y1 direction to the edge in the y2 direction in plan view.

In the present embodiment, the first insulating film 51 has a concaved portion 513 as shown in FIGS. 4 and 5. The concaved portion 513 of the first insulating film 51 is a portion of the x1-direction edge recessed in the x2 direction in plan view. In the present embodiment, the concaved portion 513 is located in the middle of the base 3 in the y direction. The concaved portion 513 is curved along the first recessed portion 332 of the base side surface 3c. In the present embodiment, the separation distance d1 between the concaved portion 513 and the first recessed portion 332 in the x direction (see FIG. 5) is shorter than the distance d2 between the x1-direction edge of the first insulating film 51 and the first flat portion 331 of the base side surface 3c in the x direction (see FIG. 5). Note that the first insulating film 51 may be without the concaved portion 513.

In the present embodiment, the first insulating film 51 has inclined surfaces 51a and 51b, as shown in FIG. 9. The inclined surface 51a faces in the x2 direction and is inclined at an angle of α1 relative to the base front surface 3a of the base 3. The inclined surface 51b faces in the x1 direction and is inclined at an angle of α2 relative to the base front surface 3a of the base 3. As shown in FIG. 9, both the angles α1 and α2 of the present embodiment are acute angles. However, the angles α1 and α2 are not limited to acute angles and may be substantially right angles or obtuse angles.

As shown in FIGS. 5, 7 and 10, the second insulating film 52 covers a portion of the second front-surface portion 421 of the second wiring 42 and a portion of the base front surface 3a. In the embodiment shown in FIGS. 5, 7 and 10, the second insulating film 52 includes a second interposed portion 521 and a second exposed portion 522.

The second interposed portion 521 is formed on the second extending portion 421d of the second insulating film 52 and covered by the light-transmitting resin 8. The second interposed portion 521 is interposed between the second extending portion 421d and the light-transmitting resin 8 in the z direction. The second interposed portion 521 is covered by the light-transmitting resin 8, with the end faces facing in the y direction left uncovered. As shown in FIG. 5, the second interposed portion 521 extends across the base front surface 3a, from the edge in the y1 direction to the edge in the y2 direction in plan view.

The second exposed portion 522 is formed on the second extending portion 421d of the second insulating film 52 and not covered by the light-transmitting resin 8. The second exposed portion 522 is connected to the second interposed portion 521 and located in the outward direction (the x2 direction) from the second interposed portion 521. As shown in FIG. 5, the second exposed portion 522 extends across the base front surface 3a, from the edge in the y1 direction to the edge in the y2 direction in plan view.

In the present embodiment, the second insulating film 52 has inclined surfaces 52a and 52b, as shown in FIG. 10. The inclined surface 52a faces in the x1 direction and is inclined at an angle of β1 relative to the base front surface 3a of the base 3. The inclined surface 52b faces in the x2 direction and is inclined at an angle of β2 relative to the base front surface 3a of the base 3. As shown in FIG. 10, both the angles β1 and β2 are acute angles. However, the angles β1 and β2 are not limited to acute angles and may be substantially right angles or obtuse angles.

As shown in FIG. 6, the polarity mark 59 is disposed on the base back surface 3b of the base 3. The polarity mark 59 is located between the first back-surface portion 413 of the first wiring 41 and the second back-surface portion 423 of the second wiring 42 in the x direction. The polarity mark 59 serves as a visual indication of the connection orientation of the light-emitting device A1. The polarity mark 59 shown in FIG. 6 has a projection in the x2 direction. However, the shape of the polarity mark 59 is not limited as long as it allows the polarities of the light-emitting device A1 to be visually identified. In the present embodiment, the polarities correspond to the anode and the cathode. Although not limited, the polarity mark 59 may be made of a resist film.

As shown in FIG. 6, the polarity mark 59 has a plurality of boundary edges 59a to 59e in plan view. As shown in FIG. 6, each of the boundary edges 59a to 59e of this embodiment is straight in plan view, although it may be curved in other embodiments. The boundary edge 59a is the end edge of the polarity mark 59 in the x1 direction and extends in the y direction. The boundary edge 59a is located between and connects the pair of boundary edges 59d. The boundary edge 59b is the end edge of the polarity mark 59 located in the x2 direction and extends in the y direction. The boundary edge 59b is located between and connects the pair of boundary edges 59e. The boundary edge 59b is shorter than the boundary edge 59a, so that the entirety of the boundary edge 59b overlaps with the boundary edge 59a as viewed in the x direction. Each boundary edge 59c is connected at one end to one of the boundary edges 59d and at the other end to one of the boundary edges 59e. The pair of boundary edges 59d are spaced apart from each other in the y direction. The boundary edge 59d located in the y1 direction has an x1-direction end connected to the boundary edge 59a and an x2-direction end connected to the boundary edge 59c located in the y1 direction. The boundary edge 59d located in the y2 direction has an x1-direction end connected to the boundary edge 59a and an x2-direction end connected to the boundary edge 59c located in the y2 direction. In the present embodiment, the pair of boundary edges 59d are substantially perpendicular to the boundary edges 59a and 59c, but this is not a limitation. In addition, the boundary edges 59d shown in FIG. 6 are aligned with the boundary edges 413a and 423a in plan view, but this is not a limitation. In other embodiments, the boundary edge 59d may be offset from the alignment, either in the inward direction or in the outward direction. The pair of boundary edges 59e are spaced apart from each other in the y direction. The boundary edge 59e located in the y1 direction has an x1-direction end connected to the boundary edge 59c located in the y1 direction and an x2-direction end connected to the boundary edge 59b. The boundary edge 59e located in the y2 direction has an x1-direction end connected to the boundary edge 59c located in the y2 direction and an x2-direction end connected to the boundary edge 59b.

The wire 6 is to provide an electrical connection between the light-emitting element 1 and the wiring pattern 4. The wire 6 is made of a conductive metal, such as Au, Cu or Al. The wire 6 is bonded by wire bonding performed by using a capillary, although the method for bonding the wire 6 is not limited to this. The wire 6 is bonded at one end to the first electrode 13 of the light-emitting element 1 and at the other end to the wire bonding portion 411a. Consequently, the wire 6 electrically connects the first electrode 13 (the light-emitting element 1) and the wire bonding portion 411a (the first wiring 41).

The bonding layer 7 bonds the light-emitting element 1 to the die bonding portion 421a of the wiring pattern 4 to provide electrical connection therebetween. The bonding layer 7 attaches the light-emitting element 1, with the element back surface 1b facing toward the base front surface 3a. The bonding layer 7 is interposed between the element back surface 1b (the second electrode 14) of the light-emitting element 1 and the die bonding portion 421a. The bonding layer 7 is electrically conductive and formed from, for example, solder or AG paste. As shown in FIG. 8, the bonding layer 7 includes a fillet 71.

The fillet 71 is formed to reach from the element back surface 1b to the element side surfaces 1c. The fillet 71 covers a portion of each element side surface 1c. The fillet 71 on each element side surface 1c spreads in the z2 direction from the edge contiguous with the element back surface 1b to cover ⅓ to ⅔ of the z-direction dimension of the light-emitting element 1.

The light-transmitting resin 8 covers the light-emitting element 1, a portion of the wiring pattern 4, a portion of the resist layer 5, the wire 6 and the bonding layer 7. The light-transmitting resin 8 is made of a resin material that transmits light. Examples of such resin materials include an epoxy resin, a silicone resin, an acyclic resin and a polyvinyl-based resin, all of which are transparent or semitransparent. The light-transmitting resin 8 may contain a fluorescent material that emits light at different wavelengths when exited by light emitted from the light-emitting element 1. The light-transmitting resin 8 is formed by transfer molding. In the present embodiment, the x-direction dimension of the light-transmitting resin 8 is smaller than the x-direction dimension of the supporting member 2 as shown in FIG. 4. The light-transmitting resin 8 has an x-direction dimension of about 1.14 mm and a y-direction dimension of about 0.8 mm. The light-transmitting resin 8 has a z-direction dimension of about 0.65 to 0.85 mm. As shown in FIGS. 1 to 4 and 7, the light-transmitting resin 8 includes a base portion 81 and a lens portion 82.

Aa shown in FIG. 7, the base portion 81 is supported on the supporting member 2 and covers the light-emitting element 1 and the wire 6. The base portion 81 may have a truncated pyramid shape, for example. In the present embodiment, the base portion 81 has a truncated pyramid shape that is larger toward the z1 direction in cross section perpendicular to the z direction. Note that the shape of the base portion 81 is not limited to a truncated pyramid and may alternatively be a rectangular parallelepiped, for example. The z-direction dimension (L81 shown in FIG. 1) of the base portion 81 is about 0.21 to 0.31 mm. In the present embodiment, the base portion 81 has a pair of first surfaces 811 and a pair of second surfaces 812, as shown in FIGS. 1 to 3, 9 and 10.

The first surfaces 811 are spaced apart from each other in the x direction, with one of the first surfaces facing generally in the x1 direction (see FIG. 9) and the other generally in the x2 direction (see FIG. 10). The first surface 811 in FIG. 9 has a lower edge in touch with the first insulating film 51 and an upper edge (located to the right of the lower edge) raised above the first insulating film 51 in the z2 direction. Similarly (or symmetrically), the other first surface 811 in FIG. 10 has a lower edge in touch with the second insulating film 52 and an upper edge (located to the left of the lower edge) raised above the second insulating film 52 in the z2 direction.

The second surfaces 812 are spaced apart from each other in the x direction, with one of the first surfaces facing generally in the x1 direction and the other generally in the x2 direction. The second surface 812 in FIG. 9 connects the relevant first surface 811 (i.e., facing generally in the x1 direction) to the lens portion 82, as shown in FIG. 1, for example. The second surface 812 in FIG. 10 connects the relevant first surface 811 (i.e., facing generally in the x2 direction) to the lens portion 82, as shown in FIG. 1. As shown in FIGS. 9 and 10, the first surfaces 811 and the second surfaces 812 are inclined relative to the z direction. The angle of inclination relative to the z direction is lager for the first surfaces 811 than for the second surfaces 812. In other words, the second surface 812 is "more parallel" to the z direction than is the first surface 811.

As shown in FIG. 7, the lens portion 82 is spaced apart from the light-emitting element 1 in the z2 direction and connected to the base portion 81 at a side remote from the supporting member 2. The lens portion 82 has a shape for collecting light beams emitted from the light-emitting element 1 to direct them in a predetermined direction (e.g., in the z2 direction). As seen from FIG. 7 (i.e., as viewed in the y direction), the lens portion 82 may have, for example, a hemispherical shape or a dome-shape bulging in the z2 direction. When the lens portion 82 is a perfect hemisphere, the radius of the hemisphere is about 0.45 to 0.55 mm, for example, and the height of the lens portion 82 (see L82 in FIG. 1; from the edge contiguous with the base portion 81 to the top in the z2 direction) is equal to that radius. Alternatively, the height of the lens portion 82 may have a different value from the size of the (generally) hemispherical portion of the lens, with the height L92 ranging from about 0.44 to 0.54 mm, so that the lens portion 82 as a whole is not necessarily a perfect hemisphere. In such an instance, the above-noted size of the generally hemispherical portion of the lens may be specified by the radius of the circular peripheral of the hemispherical portion as viewed from above the lens portion 82 (see FIG. 4).

As noted above, the light-emitting device A1 is configured such that the z-direction dimension L81 of the base portion 81 is about 0.21 to 0.31 mm, and the z-direction dimension L2 of the supporting member 2 is about 0.4 to 0.6 mm. That is, the z-direction dimension L81 of the base portion 81 of the light-transmitting resin 8 is smaller than the z-direction dimension L2 of the supporting member 2. The ratio of the z-direction dimension L81 of the base portion 81 to the z-direction dimension L2 of the supporting member 2 (L81:L2) falls in the range of about 1:1.29 to 1:2.86. In other words, the z-direction dimension L2 of the supporting member 2 is about 1.29 to 2.86 times the z-direction dimension L81 of the base portion 81.

As noted above, the light-emitting device A1 is configured such that the z-direction dimension L81 of the base portion 81 is about 0.21 to 0.31 mm, and the z-direction dimension L82 of the lens portion 82 is about 0.44 to 0.54 mm. That is, the z-direction dimension L81 of the base portion 81 of the light-transmitting resin 8 is smaller than the z-direction dimension L82 of the lens portion 82 of the light-transmitting resin 8. The ratio of the z-direction dimension L81 of the base portion 81 to the z-direction dimension L82 of the lens portion 82 (L81:L82) falls in the range of about 1:1.42 to about 1:2.57. In other words, the z-direction dimension L82 of the lens portion 82 is about 1.42 to 2.57 times the z-direction dimension L81 of the base portion 81.

As noted above, the light-emitting device A1 is configured such that the z-direction dimension L1 of the light-emitting element 1 is about 0.06 to 0.20 mm, and the z-direction dimension L81 of the base portion 81 is about 0.21 to 0.31 mm. That is, the z-direction dimension L1 of the light-emitting element 1 is smaller than the z-direction dimension L81 of the base portion 81 of the light-transmitting resin 8. The ratio of the z-direction dimension L1 of the light-emitting element 1 to the z-direction dimension L81 of the base portion 81 (L1:L81) is set to fall in the range of about 1:1.05 to 1:5.17. In other words, the z-direction dimension L81 of the base portion 81 is about 1.05 to 5.17 times the z-direction dimension L1 of the light-emitting element 1.

Referring to FIG. 12, in the light-emitting device A1, the distance or "loop height" L6 measured from the element front surface 1a to the farthest point on the wire 6 in the z2 direction may be determined in view of the z-direction dimension L1 of the light-emitting element 1. For instance, when the z-direction dimension L1 of the light-emitting element 1 is about 0.06 to 0.20 mm, the loop height L6 of the wire 6 may be about 0.10 to 0.17 mm, for example. As seen from this, the range of the loop height L6 may be narrower than (and also contained in) the range of the z-direction dimension L1. In other words, the loop height L6 of the wire 6 may not be varied as large as the dimension L1 of the light-emitting element 1 for the following reasons. It is now supposed that the dimension L1 of the light-emitting element 1 needs to be reduced, and accordingly the loop height L6 is also reduced. Unfavorably, such reduction of the loop height L6 tends to exert a larger load on the end of the wire 6 bonded to the light-emitting element 1. On the other hand, by increasing the dimension L1 of the light-emitting element 1 and accordingly the loop height L6, a larger load will be exerted on the other end of the wire 6 bonded to the wire bonding portion 411a of the first front-surface portion 411. Hence, setting the height L6 within the range described above (i.e., not too large and not too small) can reduce the loads on the respective bonded ends of the wire 6.

Figure 13:
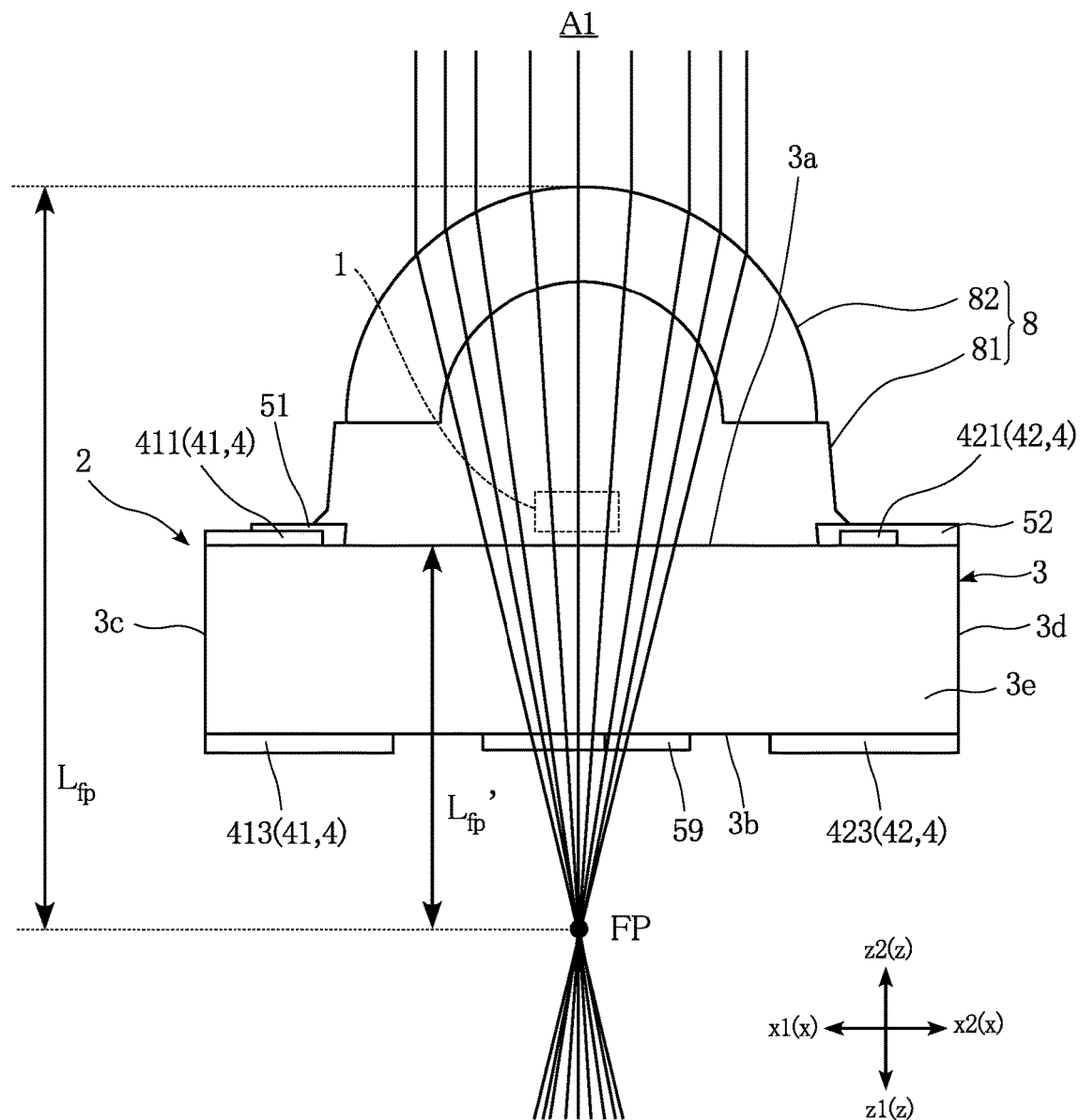
FIG. 13 is a view illustrating the focal length of the light-emitting device.

The light-emitting device A1 is designed to achieve a half-intensity angle of at least 40° in order to ensure that the irradiation range of light is not too narrow. For example, FIG. 13 shows the lens portion 82 designed to achieve a half-intensity angle of 90° when used with the light-emitting element 1 having a z-direction dimension of 0.17 mm. In the example shown in FIG. 13, the lens portion 82 is designed to have a focal length (Lfp' in FIG. 13) of about 1.29 mm. The distance from the base front surface 3a of the base 3 to the focal point FP (Lfp' in FIG. 13) is designed to be about 0.55 mm.

The following describes a display apparatus B1 employing a light-emitting device A1 according to the first embodiment.

Figure 14:
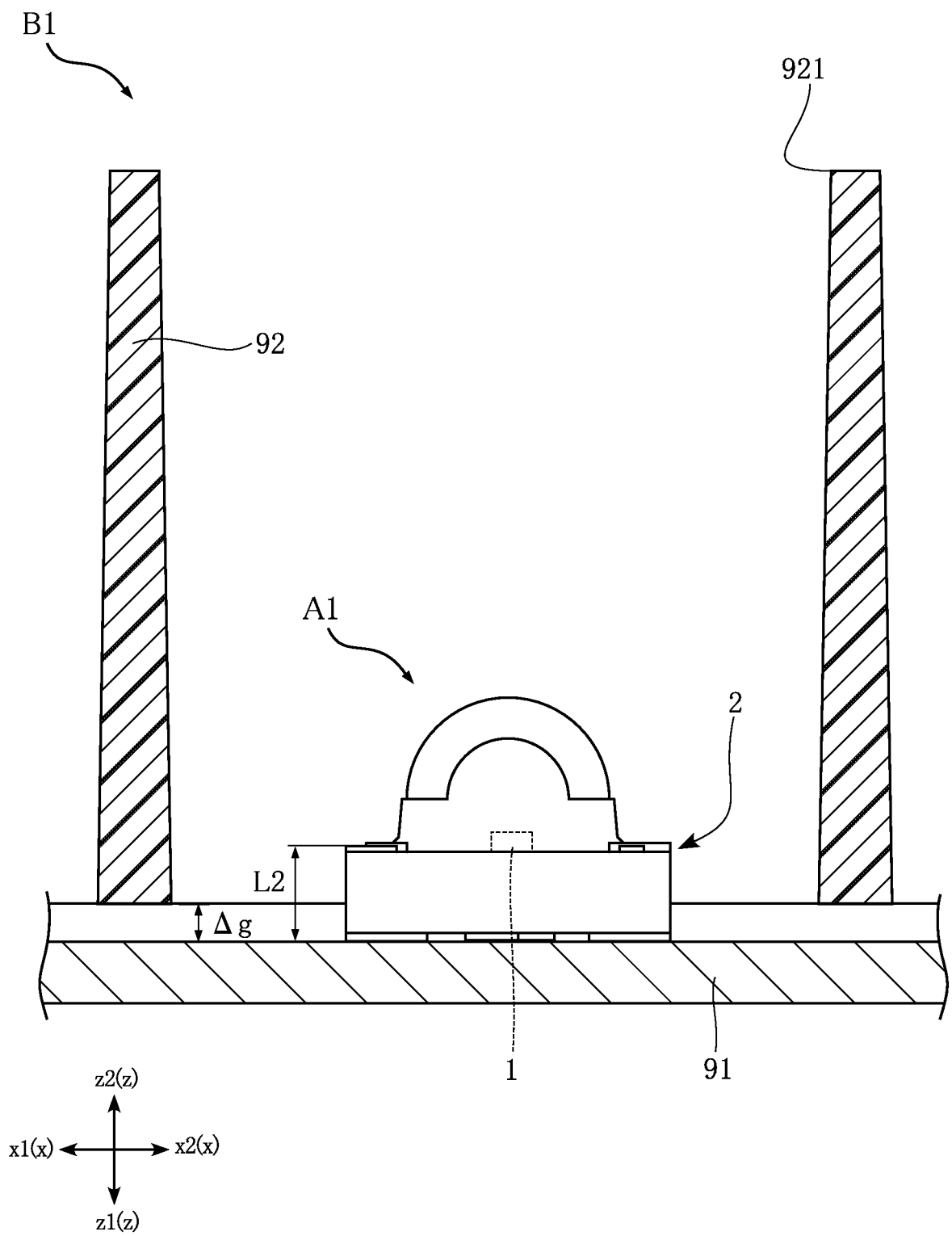
FIG. 14 is a schematic sectional view of a display apparatus that includes the display apparatus of the first embodiment.

The display apparatus B1 includes the light-emitting device A1, a mounting substrate 91 and a housing 92. FIG. 14 is a schematic sectional view of the display apparatus B1. For example, the display apparatus B1 shown in FIG. 14 is used for an instrument panel of a vehicle, and the light-emitting device A1 is used as the light source of the display apparatus B1.

The mounting substrate 91 is provided with wiring. The light-emitting device A1 is attached to the mounting substrate 91 by solder, for example. The light-emitting device A1 is mounted on the mounting substrate 91 in a manner such that the base back surface 3b of the base 3 faces the mounting substrate 91.

As shown in FIG. 14, the housing 92 surrounds the light-emitting device A1. To this end, the housing 92 and the light-emitting device A1 are provided on the same side of the mounting substrate 91. The housing 92 is made of a synthetic resin such as a polypropylene resin. The housing 92 is formed by injection molding. The housing 92 has an opening 921, which is located at the end of the housing 92 remote from the mounting substrate 91. The opening 921 has a central axis extending parallel to the z direction. In the display apparatus B1, the opening 921 may be closed by a light-transmitting plate.

In the z direction, a gap Δg is provided between the mounting substrate 91 and the housing 92. The z-direction dimension L2 of the supporting member 2 of the light-emitting device A1 is larger than the size of the gap Δg. Preferably, the z-direction dimension L2 of the supporting member 2 is at least twice the size of the gap Δg.

The following describes advantages of the light-emitting device A1 and the display apparatus B1 according to the first embodiment.

The light-emitting device A1 includes the supporting member 2 carrying the light-emitting element 1, and the supporting member 2 includes the base 3. The light-emitting element 1 faces the base front surface 3a of the base 3. That is, the light-emitting element 1 is disposed on the base 3, and the base 3 has no recess for accommodating the light-emitting element 1. Without constraints associated with the presence of an accommodating recess, this configuration enables the reduction in plan-view size.

Figure 15:
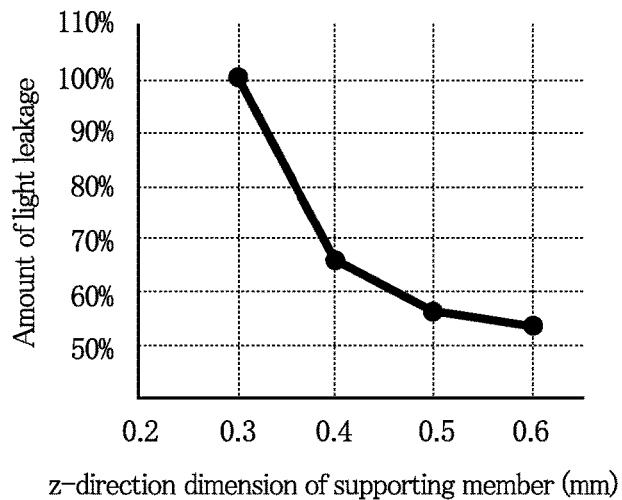
FIG. 15 is a view showing the relation between the amount of light leakage and the z-direction dimension for the display apparatus.

According to the light-emitting device A1, the base portion 81 of the light-transmitting resin 8 has a z-direction dimension L81 smaller than the z-direction dimension L2 of the supporting member 2. In other words, the z-direction dimension L2 of the supporting member 2 is larger than the z-direction dimension L81 of the base portion 81. This facilitates to configure the display apparatus B1 such that the z-direction dimension of the supporting member 2 is larger than the gap Δg between the mounting substrate 91 and the housing 92. FIG. 15 shows the relation between the amount of light leakage through the gap Δg and the z-direction dimension L2 of the supporting member 2, based on the results of tests performed by the present inventor. In FIG. 15, the horizontal axis of represents the z-direction dimension L2 of the supporting member 2, and the vertical axis represents the amount of light leakage through the gap Δg. The amount of light leakage is expressed in percentage relative to the amount of light leakage taken as 100%, which was observed when the z-direction dimension L2 of the supporting member 2 was 0.3 mm. The gap Δg in each tested sample was about 0.2 mm. As shown in FIG. 15, the present inventor has found out that the amount of light leakage through the gap Δg reduces with an increase of the z-direction dimension L2 of the supporting member 2. Therefore, with the supporting member 2 having the z-direction dimension L2 larger than the length of the gap Δg, the light-emitting device A1 can reduce leakage of emission light through the gap Δg.

According to the light-emitting device A1, the z-direction dimension L2 of the supporting member 2 is about 1.29 to 2.86 times the z-direction dimension L81 of the base portion 81 of the light-transmitting resin 8. If the z-direction dimension L2 of the supporting member 2 falls below this range, the display apparatus B1 may not be configured to appropriately reduce the amount of light leakage through the gap Δg. If, on the other hand, the z-direction dimension L2 of the supporting member 2 exceeds this range, the supporting member 2 having such a large z-direction dimension L2 increases the overall dimension of the light-emitting device A1 in the z direction. As a result, the light-emitting device A1 cannot achieve sufficient stability when mounted on the mounting substrate 91. In contrast, the supporting member 2 of the present embodiment has a z-direction dimension L2 of about 1.29 to 2.86 times the z-direction dimension L81 of the base portion 81 of the light-transmitting resin 8. This enables the display apparatus B1 to reduce the amount of light leakage through the gap Δg, and also enables the light-emitting device A1 to be mounted on the mounting substrate 91 with sufficient stability.

According to the light-emitting device A1, the supporting member 2 has a z-direction dimension L2 of about 0.4 to 0.6 mm. If the z-direction dimension L2 of the supporting member 2 falls below this range, the display apparatus B1 may not be configured to appropriately reduce the amount of light leakage through the gap Δg. If, on the other hand, the z-direction dimension L2 of the supporting member 2 exceeds this range, the first side portion 412 and/or the second side portion 422 may fail to ensure an electrical connection between the first front-surface portion 411 and the first back-surface portion 413 or between the second front-surface portion 421 and the second back-surface portion 423 for the following reason. In the fabrication process of the light-emitting device A1, the first side portion 412 and the second side portion 422 are formed by plating the entire surface of the through holes in the base 3, which are later formed into the first recessed portion 332 and the second recessed portion 342. When the z-direction dimension L2 of the supporting member 2 is large, the depth of the through holes in the base 3 is also large, making it difficult to reliably coat the entire surfaces of the through holes by plating. As a result, the first side portion 412 may not be formed all the way to the first back-surface portion 413, failing to provide the electrical continuity between the first front-surface portion 411 and the first back-surface portion 413. Similarly, the second side portion 422 may not be formed all the way to the second back-surface portion 423, failing to provide the electrical continuity between the second front-surface portion 421 and the second back-surface portion 423. With the supporting member 2 having a z-direction dimension L2 of about 0.4 to 0.6 mm, the display apparatus B1 is configured to avoid occurrence of conduction failure, and also to reduce the amount of light leakage through the gap Δg.

According to the light-emitting device A1, the light-emitting element 1 is about 0.15 to 0.31 mm in both the x- and y-direction dimensions. For the light-emitting element 1, a smaller plan-view size is desirable for reducing the size of the light-emitting device A1 in plan view, while a lager plan-view size is desirable for increasing the intensity of light emission from the light-emitting element 1. The light-emitting element 1 according to the present embodiment is about 0.15 to 0.31 mm per side as described above, with which the light-emitting device A1 can be compact in size and capable of emitting light of appropriate intensity.

According to the light-emitting device A1, the z-direction dimension L1 of the light-emitting element 1 is about 0.06 to 0.20 mm. In addition, the light-transmitting resin 8 has a lens portion 82 remote from the light-emitting element 1 in the z direction, and the lens portion 82 collects light emitted from the light-emitting element 1. The present inventor has found out that by increasing the z-direction dimension L1 of the light-emitting element 1, i.e., by reducing the distance from the light-emitting element 1 to the lens portion 82, the intensity of light emitted by the light-emitting device A1 decreases and the half-intensity angle becomes wider. On the other hand, by reducing the z-direction dimension L1 of the light-emitting element 1, i.e., by increasing the distance from the light-emitting element 1 to the lens portion 82, the intensity of light emitted by the light-emitting device A1 increases and the half-intensity angle becomes narrower. For example, with the light-emitting element 1 having a z-direction dimension L1 of 0.13 mm, the intensity light-emitting device A1 is about 36% higher than that with the light-emitting element 1 having a z-direction dimension L1 of 0.17 mm. In addition, with the light-emitting element 1 having a z-direction dimension L1 of 0.13 mm, the half-intensity angle was about 60°, while it was about 90° with the light-emitting element 1 having a z-direction dimension L1 of 0.17 mm. The above results demonstrate that the light-emitting element 1 having a z-direction dimension L1 of about 0.06 to 0.20 mm is appropriate for the light-emitting device A1 to achieve an appropriate light intensity, while ensuring an appropriate half-intensity angle that is not too narrow (no smaller than 40% in the present embodiment). When the light intensity of the light-emitting element 1 is of a higher priority, then the z-direction dimension L1 of about 0.06 to 0.13 mm are desirable. The intensity and half-intensity angle of light are adjusted by changing the z-direction dimension L1 of the light-emitting element 1, requiring no change either in the plan-view dimension of the light-emitting element 1 or in the shape of the lens portion 82. This provides another advantages that existing packages can be used and the cost increase can be avoided.

According to the light-emitting device A1, in addition, the light-emitting element 1 is bonded by the bonding layer 7 formed with the fillet 71. This improves the bonding strength of the light-emitting element 1. In an embodiment where the fillet 71 is formed, the light-emitting element 1 is configured to have a z-direction dimension L1 of 0.10 mm or larger. This ensures that the fillet 71 is not formed on the element front surface 1a.

According to the light-emitting device A1, the base portion 81 of the light-transmitting resin 8 has a z-direction dimension L81 of about 1.05 to 5.17 times the z-direction dimension L1 of the light-emitting element 1. With this configuration, a relatively large distance can be secured between the light-emitting element 1 and the lens portion 82 in the z direction.

The light-emitting device A1 is provided with the first insulating film 51 that includes the first interposed portion 511 and the first exposed portion 512. The first interposed portion 511 is located between the first front-surface portion 411 (the first extending portion 411d) of the first wiring 41 and the light-transmitting resin 8 in the z direction. The first exposed portion 512 is integral with the first interposed portion 511 and exposed from the light-transmitting resin 8. The first interposed portion 511 and the first exposed portion 512 extend from the base side surface 3c to the base side surface 3f in plan view. In the process of forming the light-transmitting resin 8 by transfer molding, the mold is pressed against the first insulating film 51 at the portion overlaid on the first extending portion 411d (the first exposed portion 512). In this state, the mold is placed in intimate contact with the first exposed portion 512. As a result, no portion of the light-transmitting resin 8 is formed on the first exposed portion 512, ensuring that the first exposed portion 512 is not covered by the light-transmitting resin 8. In this way, the transfer molding is performed without undesirable leakage of the molten state material of the light-transmitting resin 8. Note that the mold is not pressed against the portion of the first insulating film 51 overlaid on the first extending portion 411d (the first interposed portion 511) and a gap is present between the mold and the portion. The gap is filled with the molten state material of the light-transmitting resin 8. As a result, the light-transmitting resin 8 is formed to cover the first interposed portion 511.

The light-emitting device A1 is provided with the second insulating film 52 that includes the second interposed portion 521 and the second exposed portion 522. The second interposed portion 521 is located between the second front-surface portion 421 (second extending portion 421d) of the second wiring 42 and the light-transmitting resin 8 in the z direction. The second exposed portion 522 is integral the second interposed portion 521 and exposed from the light-transmitting resin 8. The second interposed portion 521 and the second exposed portion 522 extend from the base side surface 3e to the base side surface 3f in plan view. In the process of forming the light-transmitting resin 8 by transfer molding, the mold to be pressed against the second insulating film 52 at a portion overlaid on the second extending portion 421d (the portion ultimately formed into the second exposed portion 522). In this state, the mold is placed in intimate contact with the second exposed portion 522. As a result, no portion of the light-transmitting resin 8 is formed on the second exposed portion 522, ensuring that the second exposed portion 522 is not covered by the light-transmitting resin 8. In this way, the transfer molding is performed without undesirable leakage of the molten state material of the light-transmitting resin 8. Note that the mold is not pressed against the portion of the second insulating film 52 overlaid on the second extending portion 421d (the second interposed portion 521) and a gap is present between the mold and the portion. The gap is filled with the molten state material of the light-transmitting resin 8. As a result, the light-transmitting resin 8 is formed to cover the second interposed portion 521.

Figure 16:
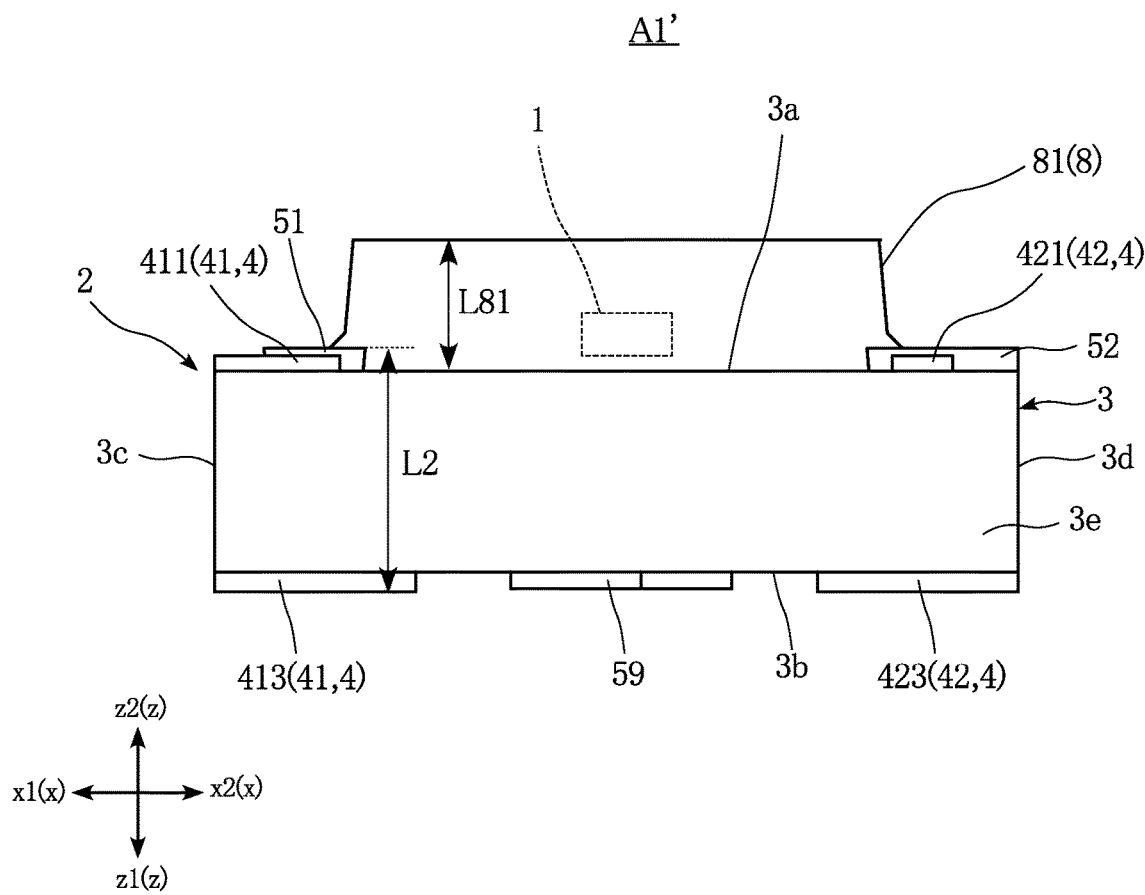
FIG. 16 is a plan view of a light-emitting device according to a variation of the first embodiment.

According to the first embodiment, the light-transmitting resin 8 includes the lens portion 82, which may be omitted. That is, the light-transmitting resin 8 may be without the lens portion 82 and composed only of the base portion 81. FIG. 16 shows a light-emitting device A1' according to such a variation. FIG. 16 is a front view of the light-emitting device A1' and corresponds to FIG. 1 showing the light-emitting device A1. The light-emitting device A1' shown in FIG. 16 has, like the light-emitting device A1 described above, no accommodating recess in the base 3 and thus can reduce the size in plan view.

According to the first embodiment, the first recessed portion 332 is formed in the base side surface 3c of the base 3. Alternatively, however, the base side surface 3c of the base 3 may be without the first recessed portion 332. That is, the entire base side surface 3c of the base 3 may be the first flat portion 331. In such a variation, the first side portion 412 of the first wiring 41 covers the first flat portion 331, which is equal to the entire base side surface 3c. The light-emitting device A1' of this variation has, like the light-emitting device A1 described above, no accommodating recess in the base 3 and thus can reduce the size in plan view.

According to the first embodiment, the second recessed portion 342 is formed in the base side surface 3d of the base 3. Alternatively, however, the base side surface 3d of the base 3 may be without the second recessed portion 342. That is, the entire base side surface 3d of the base 3 may be the second flat portion 341. In such a variation, the second side portion 422 of the second wiring 42 covers the second flat portion 341, which is equal to the entire base side surface 3c. The light-emitting device of this variation has, like the light-emitting device A1 described above, no accommodating recess in the base 3 and thus can be configured to reduce the size in plan view.

FIGS. 17 to 20 are views of a light-emitting device according to a second embodiment. The light-emitting device A2 of the second embodiment differs from the light-emitting device A1 mainly in the configuration of the light-emitting element 1 and the wiring pattern 4.

Figure 17:
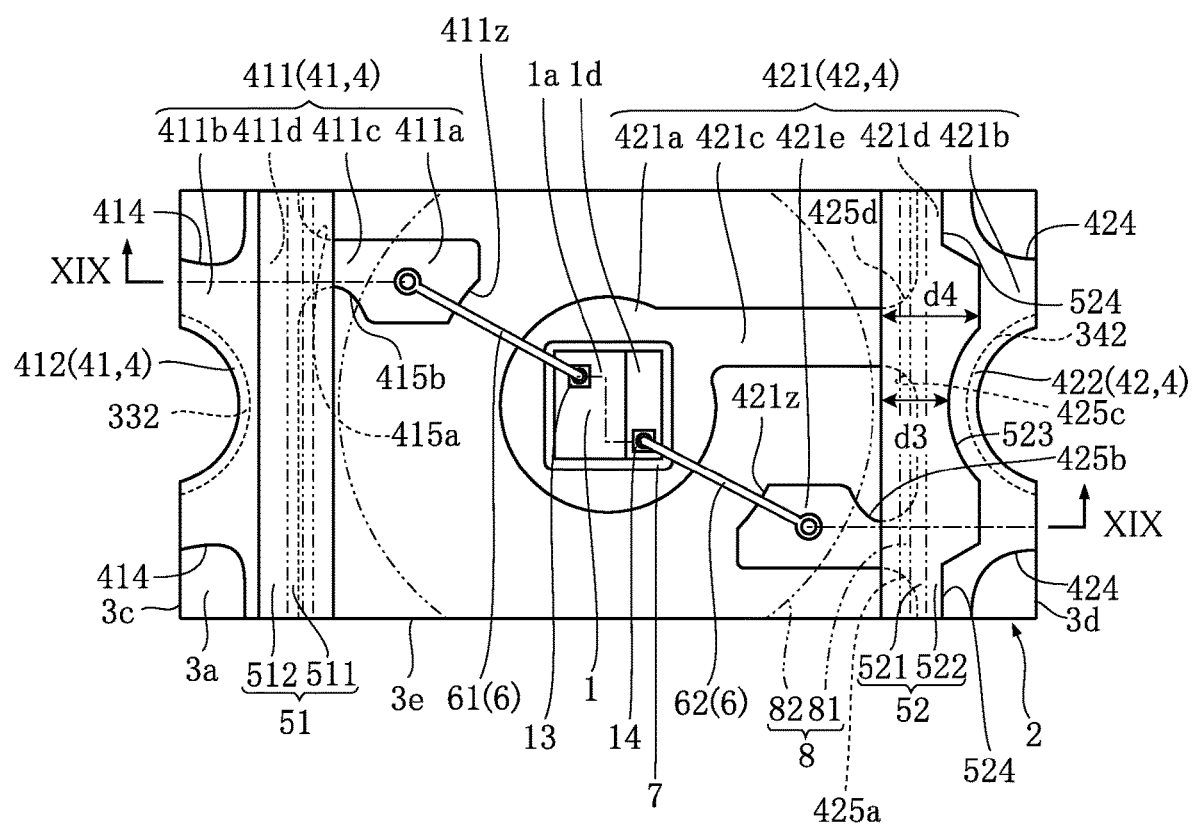
FIG. 17 is a plan view of a light-emitting device (with the light-transmitting resin omitted) according to a second embodiment.
Figure 18:
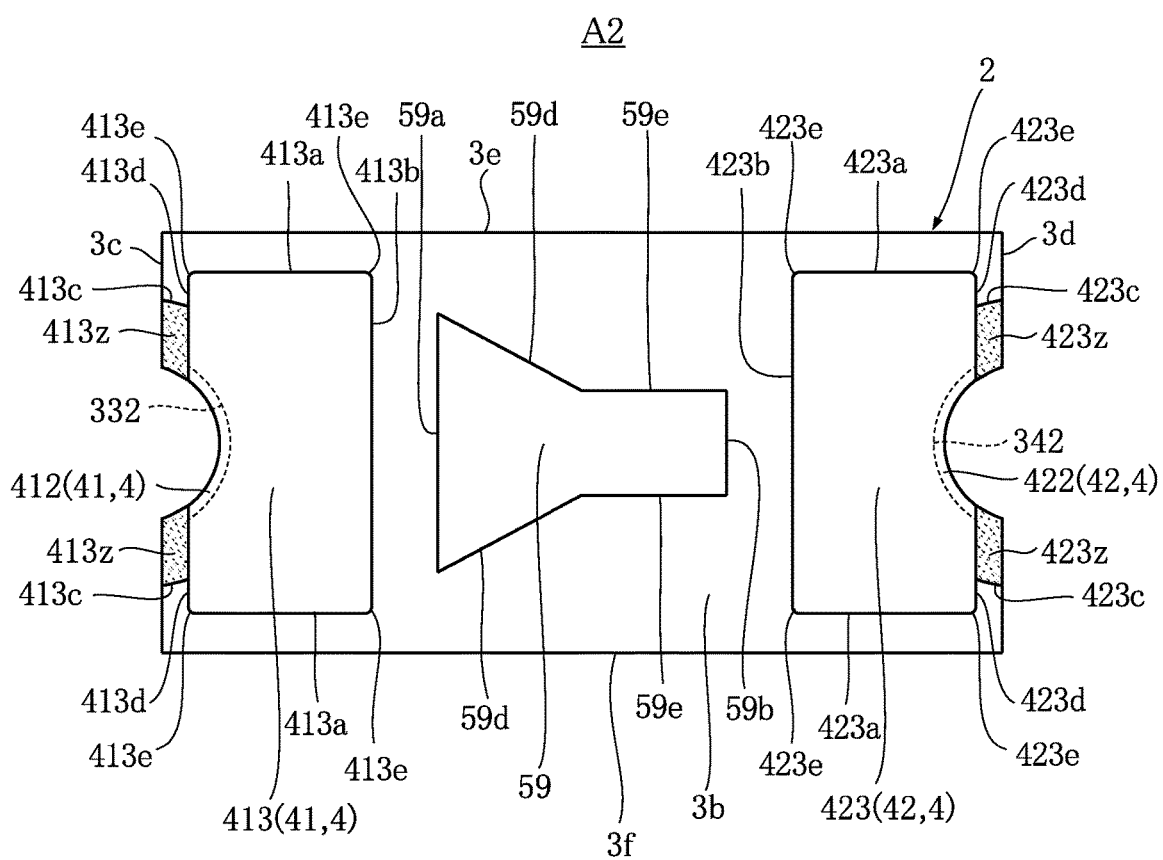
FIG. 18 is a bottom view of the light-emitting device according to the second embodiment.
Figure 19:
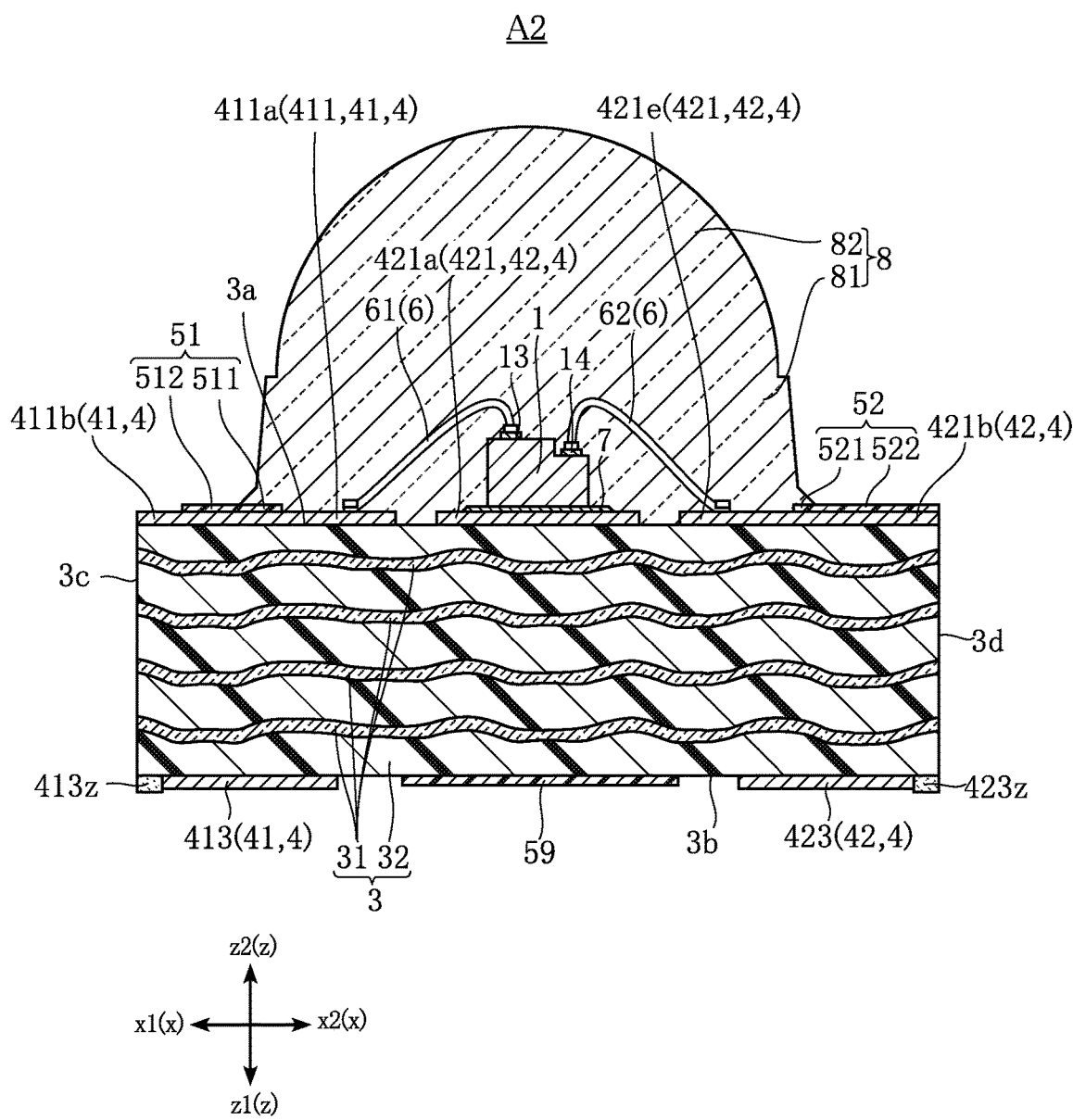
FIG. 19 is a sectional view taken along line XIX-XIX of FIG. 17.
Figure 20:
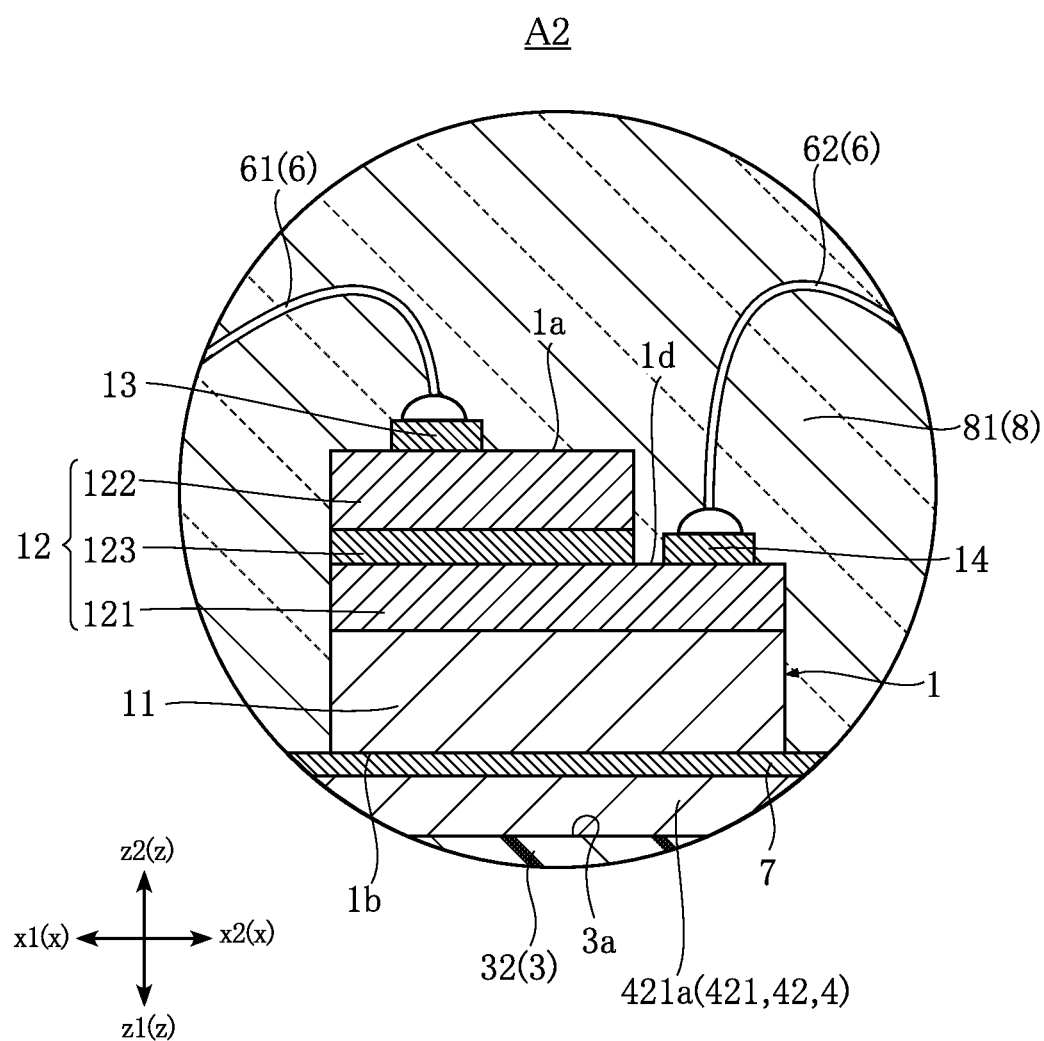
FIG. 20 is a fragmentary enlarged sectional view of FIG. 19, showing the cross-sectional structure of the light-emitting element.

FIG. 17 is a plan view of the light-emitting device A2. In FIG. 17, the light-transmitting resin 8 is indicated by phantom lines (chain double-dashed lines). FIG. 18 is a bottom view of the light-emitting device A2. FIG. 19 is a sectional view taken along line XIX-XIX of FIG. 17. FIG. 20 is a fragmentary enlarged sectional view of FIG. 19, showing the cross-sectional structure of the light-emitting element 1. The cross-sectional structure of the light-emitting element 1 shown in FIG. 20 is in schematic form and the components may not be precise in their relative sizes.

Unlike the light-emitting device A1, the light-emitting device A2 includes a plurality of wires 6. In present embodiment, the plurality of wires 6 includes a first wire 61 and a second wire 62. The first wire 61 and the second wire 62 are made of the same material as the wire 6 of the first embodiment.

The first wire 61 electrically connects the light-emitting element 1 and the first wiring 41. The first wire 61 is bonded at one end to the first electrode 13 of the light-emitting element 1, and at the other end to the wire bonding portion 411a of the first wiring 41.

The second wire 62 electrically connects the light-emitting element 1 and the second wiring 42. The second wire 62 is connected at one end to the second electrode 14 of the light-emitting element 1 and at the end to the second front-surface portion 421 (specifically, to a wire bonding portion 421e, which will be described later) of the second wiring 42.

In the present embodiment, the light-emitting element 1 has a recessed portion 1d as shown in FIG. 20. The recessed portion 1d is recessed from the element front surface 1a in the z1 direction to reach the upper surface of the n-type semiconductor layer 121. The recessed portion 1d is rectangular in plan view. The recessed portion 1d is connected to three of the element side surfaces 1c (each facing in a different one of the x2, y1 and y2 directions) of the light-emitting element 1. According to the present embodiment, due to the presence of the recessed portion 1d, the areas of the light-emitting layer 123 and the p-type semiconductor layer 122 are smaller in plan view than the element substrate 11. Note that the area of the n-type semiconductor layer 121 is equal to the area of the element substrate 11 in plan view.

In this light-emitting element 1, the first electrode 13 is formed on the element front surface 1a as shown in FIG. 20, like in the first embodiment. Unlike the first embodiment, however, the second electrode 14 is not formed on the element back surface 1b. Rather, the second electrode 14 is formed on the upper surface of the n-type semiconductor layer 121 exposed in the recessed portion 1d. One end of the first wire 61 is bonded to the first electrode 13, and one end of the second wire 62 is bonded to the second electrode 14.

According to the present embodiment, the first front-surface portion 411 is formed with a pair of first cutaway portions 414 as shown in FIG. 17. The first cutaway portions 414 are located at either end of the first front-surface portion 411 in the y direction. Each first cutaway portion 414 is recessed from a corner of the base front surface 3a of the base 3 connected to the base side surface 3c to the inner side of the first front-surface portion 411. Each first cutaway portion 414 is substantially rectangular in plan view. The base front surface 3a is exposed from each first cutaway portion 414.

According to the present embodiment, in addition, the first front-surface portion 411 has a plurality of curved portions 415a and 415b as shown in FIG. 17. The curved portion 415a is formed on the edge of the first connecting portion 411c in the y2 direction. The curved portion 415b connects the y1-direction edge of the first connecting portion 411c and the x2-direction edge of the first extending portion 411d.

According to the present embodiment, the first back-surface portion 413 is formed with a pair of first bumps 413z as shown in FIG. 18. In FIGS. 18 and 19, the first bumps 413z are shaded. The first bumps 413z are disposed on the base back surface 3b of the base 3 and contiguous with the base side surface 3c of the base 3. Each first bump 413z protrudes in the z1 direction. In the present embodiment, in addition, the first back-surface portion 413 has rounded corners 413e as shown in FIG. 18.

According to the present embodiment, the second front-surface portion 421 further includes a wire bonding portion 421e as shown in FIG. 17. One end of the second wire 62 is bonded to the wire bonding portion 421e. Consequently, the wire bonding portion 421e is electrically connected to the second electrode 14 of the light-emitting element 1 by the second wire 62. The wire bonding portion 421e is integral with the second extending portion 421d as shown in FIG. 17. As shown in FIG. 17, the wire bonding portion 421e is substantially rectangular in plan view. The wire bonding portion 421e has a second opposing edge 421z as shown in FIG. 17. The second opposing edge 421z faces the peripheral edge of the die bonding portion 421a of the second front-surface portion 421 in plan view. The second opposing edge 421z is a predetermined distance away from the peripheral edge of the die bonding portion 421a.

According to the present embodiment, the second front-surface portion 421 is formed with a pair of second cutaway portions 424 as shown in FIG. 17. The second cutaway portions 424 are located at either end of the second front-surface portion 421 in the y direction. Each second cutaway portion 424 is recessed from a corner of the base front surface 3a of the base 3 connected to the base side surface 3d to the inner side of the second front-surface portion 421. Each second cutaway portion 424 is substantially in a quarter circular shape in plan view. The "quarter circular shape" is the shape of a half of a semicircle. That is, the shape of the first cutaway portions 414 differs from that of the second cutaway portions 424 in plan view. The base front surface 3a is exposed from each second cutaway portion 424.

According to the present embodiment, in addition, the second front-surface portion 421 has a plurality of curved portions 425a to 425d as shown in FIG. 17. The curved portion 425a connects the y1-direction edge of the wire bonding portion 421e and the x1-direction edge of the second extending portion 421d. The curved portion 425b is formed on the y2-direction edge of the wire bonding portion 421e connected to the second extending portion 421d (the x2-direction edge). The curved portion 425c connects the y1-direction edge of the second connecting portion 421c and the x1-direction edge of the second extending portion 421d. The curved portion 425d connects the y2-direction edge of the second connecting portion 421c and the x1-direction edge of the second extending portion 421d.

According to the present embodiment, the second back-surface portion 423 is formed with a pair of second bumps 423z as shown in FIG. 18. In FIGS. 18 and 19, the second bumps 423z are shaded. The second bumps 423z are disposed on the base back surface 3b and contiguous with the base side surface 3d of the base 3. Each second bump 423z protrudes in the z1 direction. In the present embodiment, in addition, the second back-surface portion 423 has rounded corners 423e as shown in FIG. 18.

According to the present embodiment, the first insulating film 51 has a strip shape extending in the y direction in plan view as shown in FIG. 17. The first insulating film 51 of present embodiment may be formed with the concaved portion 513.

According to the present embodiment, the second insulating film 52 has a concaved portion 523 as shown in FIG. 17. The concaved portion 523 of the second insulating film 52 is curved from the x2-direction edge in the x1 direction. In the present embodiment, the concaved portion 523 is located at the center of the base 3 in the y direction. The concaved portion 523 is curved along the second recessed portion 342 of the base side surface 3d. The second insulating film 52 has a pair of retracted portions 524. The retracted portions 524 of the second insulating film 52 are formed at the y-direction ends of the x2-direction edge. As shown in FIG. 17, the retracted portions 524 are offset in the x1 direction such that the second insulating film 52 does not overlap with the second cutaway portions 424 in plan view. In the second insulating film 52, the x-direction dimension d3 where the concaved portion 523 is present is smaller than the x-direction dimension d4 where neither the concaved portion 523 nor the retracted portion 524 is present.

The present embodiment is provided with a polarity mark 59 shown in FIG. 18. Unlike the polarity mark 59 of the first embodiment, the polarity mark 59 of this embodiment does not have the pair of boundary edges 59c. The boundary edges 59d and 59e in the y1 direction are directly connected to each other (more specifically, the x2-direction end of the boundary edge 59d is connected to the x1-direction end of the boundary edge 59e), and the boundary edges 59d and 59e in the y2 direction are directly connected to each other (more specifically, the y2-direction end of the boundary edge 59d is connected to the x1-direction end of the boundary edge 59e). In the present embodiment, the boundary edges 59d are inclined in both the x and y directions to be directly connected to the boundary edges 59d and 59e. Note that the boundary edges 59e may be inclined in the x and y directions.

According to the present embodiment, the bonding layer 7 bonds the light-emitting element 1 to the die bonding portion 421a of the wiring pattern 4, like in the first embodiment. In the present embodiment, the bonding layer 7 does not have to be conductive because the second electrode 14 of the light-emitting element 1 is not formed on the element back surface 1b. As such, the bonding layer 7 and may simply be an adhesive. According to the present embodiment, the bonding layer 7 is made from a paste of synthetic resin containing an epoxy resin as a base material, and silver (Ag) particles are added to the base material. Note, however, that the materials of the bonding layer is not limited to such.

The light-emitting device A2 configured as described above is suitable for the light source of the display apparatus B1 (see FIG. 14), as in the first embodiment.

According to the light-emitting device A2, the light-emitting element 1 is mounted on the supporting member 2, which includes the base 3. The light-emitting element 1 faces the base front surface 3a of the base 3. Like the light-emitting device A1, the light-emitting device A2 is without constraints associated with the presence of an accommodating recess, allowing for the reduction of the plan-view size. In addition, the light-emitting device A2 can also achieve other advantages described above for the light-emitting device A1.

According to the light-emitting device A2, the first front-surface portion 411 of the first wiring 41 has the first cutaway portions 414 at either end in the y direction. Each first cutaway portion 414 is recessed from a corner of the base front surface 3a of the base 3 connected to the base side surface 3c to the inner side of the first front-surface portion 411. The base front surface 3a is exposed from each first cutaway portion 414. This configuration serves to reduce the area of the end faces of the first front-surface portion 411 each of which is flush with one of the base side surface 3c, 3e and 3f. This contributes to reduce the formation of metal burrs resulting from cutting the first wiring 41 in the manufacturing process of the light-emitting device A2.

According to the light-emitting device A2, the second front-surface portion 421 of the second wiring 42 has the second cutaway portions 424 at either end in the y direction. Each second cutaway portion 424 is recessed from a corner of the base front surface 3a of the base 3 connected to the base side surface 3d to the inner side of the second front-surface portion 421. The base front surface 3a is exposed from each second cutaway portion 424. This configuration serves to reduce the area of the end faces of the second front-surface portion 421 each of which is flush with one of the base side surface 3c, 3e and 3f. This contributes to reduce the formation of metal burrs resulting from cutting the second wiring 42 in the manufacturing process of the light-emitting device A2.

According to the light-emitting device A2, the first cutaway portions 414 of the first front-surface portion 411 have a plan-view shape different from the plan-view shape of the second cutaway portions 424 of the second front-surface portion 421. This enables visual identification of the anode and the cathode of the light-emitting device A2 by inspecting the already mounted on a mounting substrate (e.g., mounting substrate 91) from outside.

According to the light-emitting device A2, the first back-surface portion 413 of the first wiring 41 has the first bumps 413z disposed on the on the base back surface 3b of the base 3 to be contiguous with the base side surface 3c. The first bumps 413z protrude in the z1 direction. This configuration produces an anchor effect between the first back-surface portion 413 and solder when the light-emitting device A2 is attached to a mounting substrate (e.g., the mounting substrate 91), thereby improving the bonding strength of the light-emitting device A2 to the mounting substrate.

According to the light-emitting device A2, the second back-surface portion 423 of the second wiring 42 has the second bumps 423z disposed on the on the base back surface 3b of the base 3 to be contiguous with the base side surface 3d. The second bumps 423z protrudes in the z1 direction. This configuration produces an anchor effect between the second back-surface portion 423 and solder when the light-emitting device A2 is attached to a mounting substrate (e.g., the mounting substrate 91), thereby improving the bonding strength of the light-emitting device A2 to the mounting substrate.

For the light-emitting device A2 is described as having the lens portion 82 in the light-transmitting resin 8, but this is not a limitation. In an alternative, the lens portion 82 may be omitted like in the light-emitting device A1' according to the variation of the first embodiment (see FIG. 16).

The light-emitting device A2 is described as having the first recessed portion 332 in the base side surface 3c, but this is not a limitation. In an alternative, the first recessed portion 332 may be omitted and the entire base side surface 3c may comprise the first flat portion 331 like in the first embodiment. Similarly, in addition, the base side surface 3d may be without the second recessed portion 342 and the entire base side surface 3d may comprise the second flat portion 341.

The present disclosure is not limited to the light-emitting devices and the display apparatuses according to the embodiments described above. Various design changes may be made to one or more components of the light-emitting devices and the display apparatuses according to the present disclosure.

The invention claimed is:

1. A light-emitting device comprising:
a light-emitting element having an element front surface and an element back surface spaced apart from each other in a first direction;
a supporting member on which the light-emitting element is mounted; and
a light-transmitting resin formed on the supporting member to cover the light-emitting element,
wherein the supporting member includes:
a base having a base front surface and a base back surface opposite to the base front surface, and
a first wiring and a second wiring each disposed on the base and electrically connected to the light-emitting element,
wherein the light-emitting element is mounted on the support member with the element back surface facing the base front surface,
wherein the light-transmitting resin includes:
a lens portion; and
a base portion located between the lens portion and the supporting member in the first direction and surrounding the light-emitting element,
wherein a distance between the element back surface and the base back surface in the first direction is larger than a dimension of the base portion in the first direction.

2. The light-emitting device according to claim 1, wherein the distance between the element back surface and the base back surface is 1.29 to 2.86 times the dimension of the base portion in the first direction.

3. The light-emitting device according to claim 1, wherein the dimension of the base portion in the first direction is smaller than a dimension of the lens portion in the first direction.

4. The light-emitting device according to claim 3, wherein the dimension of the lens portion in the first direction is 1.42 to 2.57 times the dimension of the base portion in the first direction.

5. The light-emitting device according to claim 1, wherein the dimension of the base portion in the first direction is 1.05 to 5.17 times a dimension of the light-emitting element in the first direction.

6. The light-emitting device according to claim 1, wherein the base portion has a truncated pyramid shape, and the lens portion has a dome shape bulging in the first direction.

7. The light-emitting device according to claim 1, wherein a dimension of the light-emitting element in the first direction is 0.06 to 0.20 mm.

8. The light-emitting device according to claim 1, wherein the base includes a plurality of glass cloths laminated in the first direction and an impregnated resin impregnated in the glass cloths.

9. The light-emitting device according to claim 8, wherein the plurality of glass cloths include at least four glass cloths.

10. The light-emitting device according to claim 1, wherein the base has a first side surface and a second side surface that are spaced apart from each other in a second direction perpendicular to the first direction, and
wherein a dimension of the base in the second direction is larger than a dimension of the light-transmitting resin in the second direction.

11. The light-emitting device according to claim 10, wherein the first wiring includes a first front-surface portion, a first side portion and a first back-surface portion, the first front-surface portion being electrically connected to the light-emitting element and in contact with the base front surface, the first side portion being connected to the first front-surface portion and in contact with the first side surface, the first back-surface portion being connected to the first side portion and in contact with the base back surface.

12. The light-emitting device according to claim 11, further comprising a wire connected to the light-emitting element and the first wiring,
wherein the light-emitting element includes a front-surface electrode to which the wire is bonded, and
the first front-surface portion includes a wire bonding portion to which the wire is bonded.

13. The light-emitting device according to claim 11, further comprising a first insulating, wherein
the first front-surface portion includes a first extending portion extending in a third direction perpendicular to the first direction and the second direction,
the base has a first edge and a second edge that are spaced apart from each other in the third direction,
the first extending portion extends from the first edge to the second edge of the base,
the first insulating film includes a first exposed portion formed on the first extending portion and exposed from the light-transmitting resin, and
the first exposed portion extends from the first edge to the second edge of the base.

14. The light-emitting device according to claim 10, wherein the second wiring includes a second front-surface portion, a second side portion and a second back-surface portion, the second front-surface portion being electrically connected to the light-emitting element and in contact with the base front surface, the second side portion of the second wiring being connected to the second front-surface portion and in contact with the second side surface of the base, the second back-surface portion being connected to the second side portion of the second wiring and in contact with the base back surface,
wherein the second side surface of the base includes a second flat portion and a second recessed portion, the second recessed portion being recessed form the second flat portion and extending from the base front surface to the base back surface, and
wherein the second side portion of the second wiring is in contact with the second recessed portion.

15. The light-emitting device according to claim 14, wherein the second front-surface portion includes a die bonding portion to which the light-emitting element is bonded.

16. The light-emitting device according to claim 15, further comprising a bonding layer, wherein the light-emitting element includes a back-surface electrode, and the bonding layer electrically connects the back-surface electrode and the die bonding portion.

17. The light-emitting device according to claim 14, further comprising a second insulating film, wherein
the second front-surface portion includes a second extending portion extending in a third direction perpendicular to the first direction and the second direction,
the base has a first edge and a second edge that are spaced apart from each other in the third direction,
the second extending portion extends from the first edge to the second edge of the base,
the second insulating film includes a second exposed portion formed on the second extending portion and exposed from the light-transmitting resin, and
the second exposed portion extends from the first edge to the second edge of the base.

18. A display apparatus comprising:
a light-emitting device comprising:
a light-emitting element having an element front surface and an element back surface spaced apart from each other in a first direction;
a supporting member on which the light-emitting element is mounted; and
a light-transmitting resin formed on the supporting member to cover the light-emitting element, wherein the supporting member includes:
a base having a base front surface and a base back surface opposite to the base front surface, and
a first wiring and a second wiring each disposed on the base and electrically connected to the light-emitting element, wherein the light-emitting element is mounted on the support member with the element back surface facing the base front surface;
a mounting substrate on which the light-emitting device is mounted; and
a housing surrounding the light-emitting device,
wherein the mounting substrate and the housing are spaced apart from each other with a gap in the first direction, and
a dimension of the supporting member of the light-emitting device in the first direction is larger than a distance between the mounting substrate and the housing in the first direction.

* * * * *